(12) United States Patent
Lu

(10) Patent No.: US 11,101,541 B2
(45) Date of Patent: Aug. 24, 2021

(54) SEMICONDUCTOR ASSEMBLY AND METHOD FOR MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 64 days.

(21) Appl. No.: 16/592,550

(22) Filed: Oct. 3, 2019

(65) Prior Publication Data

US 2021/0104810 A1   Apr. 8, 2021

(51) Int. Cl.
| | |
|---|---|
| *H01L 21/00* | (2006.01) |
| *H01Q 1/22* | (2006.01) |
| *H01L 23/52* | (2006.01) |
| *H01L 23/28* | (2006.01) |
| *H01L 23/66* | (2006.01) |

(52) U.S. Cl.
CPC ........... *H01Q 1/2283* (2013.01); *H01L 23/28* (2013.01); *H01L 23/52* (2013.01); *H01L 23/66* (2013.01)

(58) Field of Classification Search
CPC ........ H01Q 1/2283; H01L 23/52; H01L 23/28
See application file for complete search history.

(56) References Cited

U.S. PATENT DOCUMENTS

| | | | | |
|---|---|---|---|---|
| 7,518,229 | B2* | 4/2009 | Cotte | H01L 23/66 257/698 |
| 9,431,369 | B2* | 8/2016 | Chih | H01Q 1/2283 |
| 9,461,355 | B2* | 10/2016 | Nair | H01Q 1/2291 |
| 10,270,172 | B2* | 4/2019 | Liu | H01L 24/19 |
| 2006/0081982 | A1* | 4/2006 | Huang | H01L 23/5227 257/737 |
| 2015/0262931 | A1* | 9/2015 | Vincent | H01L 24/82 257/773 |
| 2017/0092567 | A1* | 3/2017 | Vincent | B32B 5/18 |
| 2018/0331050 | A1* | 11/2018 | Chung | H01L 23/3121 |
| 2018/0342470 | A1* | 11/2018 | Liao | H01L 23/66 |
| 2018/0358685 | A1* | 12/2018 | Han | H01L 23/5384 |
| 2019/0221529 | A1* | 7/2019 | Yong | H01L 23/552 |
| 2020/0303806 | A1* | 9/2020 | Wu | H01L 23/49816 |
| 2020/0335858 | A1* | 10/2020 | Chen | H01L 23/5384 |
| 2020/0350180 | A1* | 11/2020 | Yen | H01L 21/4825 |
| 2021/0013585 | A1* | 1/2021 | Ho | H01Q 1/526 |
| 2021/0020579 | A1* | 1/2021 | Lu | H01L 21/7685 |
| 2021/0083388 | A1* | 3/2021 | Lu | H01L 23/5389 |
| 2021/0104810 | A1* | 4/2021 | Lu | H01L 23/28 |

FOREIGN PATENT DOCUMENTS

WO    WO-2017222471 A1 * 12/2017 ......... H01Q 21/0093

* cited by examiner

*Primary Examiner* — Laura M Menz

(74) *Attorney, Agent, or Firm* — Foley & Lardner LLP

(57) ABSTRACT

A semiconductor assembly includes a first wiring structure, a first semiconductor die and a first electronic element. The first wiring structure has a first surface. The first semiconductor die is disposed on the first surface of the first wiring structure. The first electronic element is electrically connected to the first wiring structure. The first electronic element includes a first metal layer, a second metal layer and a dielectric material interposed between the first metal layer and the second metal layer. The first metal layer and the second metal layer are substantially perpendicular to the first surface of the first wiring structure.

16 Claims, 32 Drawing Sheets

SEMICONDUCTOR ASSEMBLY AND METHOD FOR MANUFACTURING THE SAME

BACKGROUND

1. Field of the Disclosure

The present disclosure relates to a semiconductor assembly and a method, and to a semiconductor assembly including an electronic element, and a method for manufacturing the semiconductor assembly.

2. Description of the Related Art

Design trends in the semiconductor industry include weight reduction, multi-functions and miniaturization of semiconductor products. Thus, a system-in-package (SiP) containing multiple electronic devices (or electronic elements) in a single package is rapidly promoted. To meet the demand of mobile device and wireless communication, antenna on package (AoP) or antenna in package (AiP) is a new approach to integrate an antenna element in the system-in-package (SiP), which may reduce the total size of the final package and provide a good radiation performance of the antenna element. However, the radiation performance of the antenna element, the electrical performance of the final package and the total size of the final package may be affected by the size and location of the antenna element, especially when the final package becomes smaller and smaller. Thus, it is desired to design a suitable antenna element in the final package.

SUMMARY

In some embodiments, a semiconductor assembly includes a first wiring structure, a first semiconductor die and a first electronic element. The first wiring structure has a first surface. The first semiconductor die is disposed on the first surface of the first wiring structure. The first electronic element is electrically connected to the first wiring structure. The first electronic element includes a first metal layer, a second metal layer and a dielectric material interposed between the first metal layer and the second metal layer. The first metal layer and the second metal layer are substantially perpendicular to the first surface of the first wiring structure.

In some embodiments, a semiconductor assembly includes a wiring structure, a semiconductor die and an electronic element. The wiring structure has a first surface. The semiconductor die is disposed on the first surface of the first wiring structure. The electronic element is electrically connected to the wiring structure. The electronic element includes a first metal layer, a second metal layer and a dielectric material interposed between the first metal layer and the second metal layer. The first metal layer and the second metal layer are electrically connected to a same circuit layer of the first wiring structure.

In some embodiments, a method for manufacturing a semiconductor assembly includes: (a) providing an electronic element including a first metal layer, a second metal layer and a dielectric material disposed between the first metal layer and the second metal layer; (b) providing a wiring structure having a first surface; (c) disposing a semiconductor die on the first surface of the wiring structure; and (d) electrically connecting the electronic element to the wiring structure, wherein the first metal layer and the second metal layer of the electronic element are substantially perpendicular to a first surface of the wiring structure.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
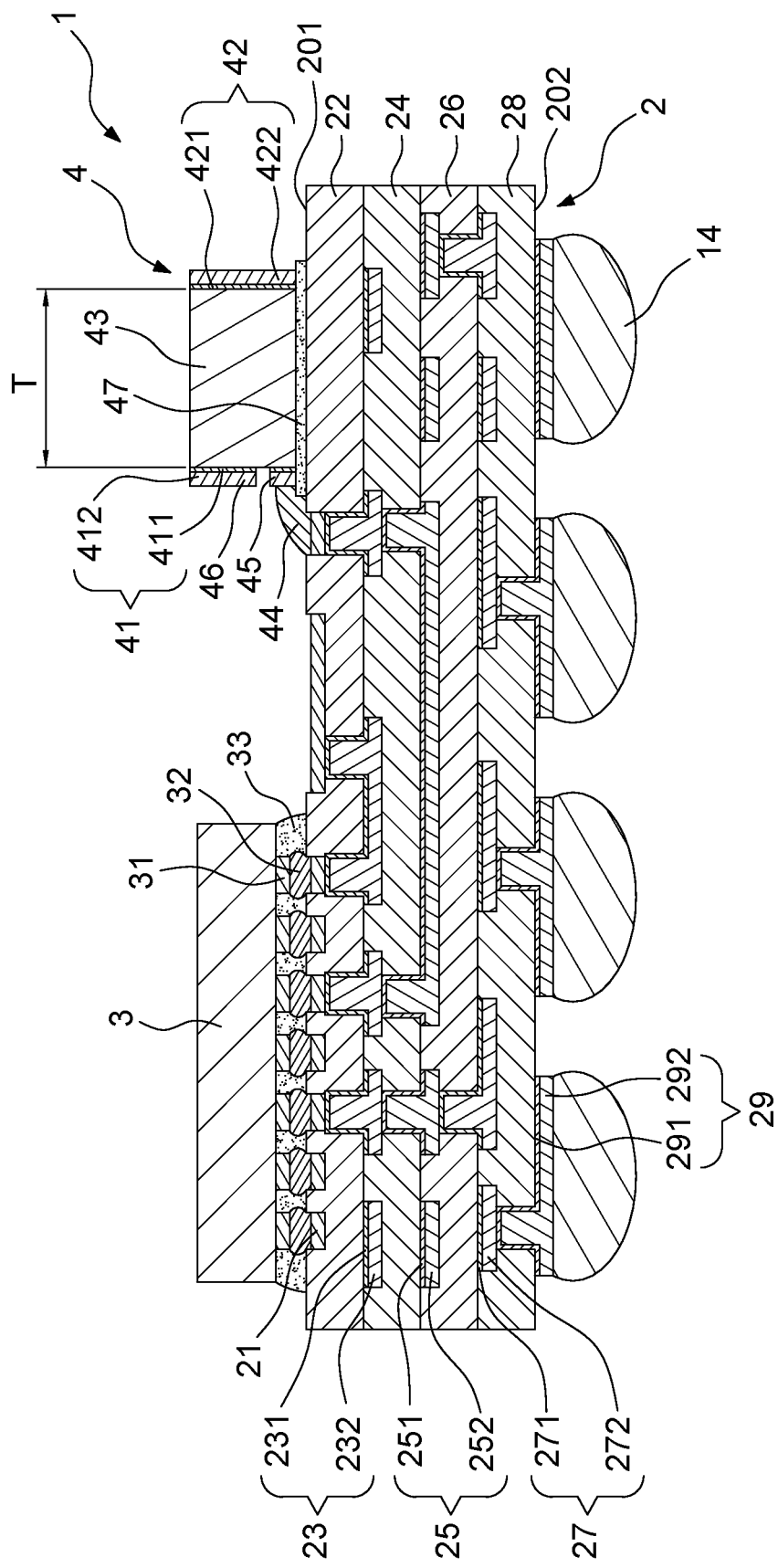
FIG. 1 illustrates a cross-sectional view of an example of a semiconductor assembly according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a comparative embodiment, a semiconductor package structure may include a package substrate, a plurality of electronic devices (or electronic elements) electrically connected to the package substrate, and an antenna element embedded in the package substrate. The package substrate may at least include a topmost dielectric layer, a first circuit layer (e.g., a topmost circuit layer) and a second circuit layer. The topmost dielectric layer has a top surface and a bottom surface, the first circuit layer is disposed adjacent to the top surface of the topmost dielectric layer, and the second circuit layer is disposed adjacent to the bottom surface of the topmost dielectric layer. That is, the second circuit layer may be covered by the topmost dielectric layer. Usually, the first circuit layer may include an antenna pattern disposed on a sandwiched portion of the topmost dielectric layer of the package substrate. The antenna pattern is electrically coupled with a coupling portion of the second circuit layer. That is, the sandwiched portion of the topmost dielectric layer is interposed between the antenna pattern and the coupling portion of the second circuit layer. Thus, the antenna pattern, the coupling portion of the second circuit layer and the sandwiched portion of the topmost dielectric layer form the antenna element, which is like a sandwich structure.

The thickness and performance of the semiconductor package structure and the antenna element is affected by the material property and thickness of the sandwiched portion of the topmost dielectric layer. For example, as the frequency of the application band of the antenna element is getting higher, the size of the antenna element may be significantly reduced. However, in order to achieve a predetermined radiation performance of the antenna element, the thickness of the sandwiched portion of the topmost dielectric layer may increase corresponding to the increased frequency. The increment of the thickness may be more prominent if the topmost dielectric layer has a high dielectric constant (Dk) and a high dissipation factor (Df). Thus, the thickness of the semiconductor package structure may also increase. In addition, if the thickness of the sandwiched portion of the topmost dielectric layer is not large enough, an undesired coupling capacitance and an undesired coupling current may occur. Thus, the radiation performance of the antenna element and the electrical performance of the semiconductor package structure may be adversely affected.

Theoretically, the coupling capacitance (C) of the antenna element may be calculated as below:

$$C = A \cdot \varepsilon_0 \cdot \varepsilon_d / d$$

$$I = C(dv/dt)$$

wherein:
A: Antenna area (area of the antenna pattern of the first circuit layer and/or the coupling portion of the second circuit layer),
d: Distance (or Gap) between the antenna pattern of the first circuit layer and the coupling portion of the second circuit layer (e.g., a thickness of the sandwiched portion of the topmost dielectric layer),
$\varepsilon_0$: Air dielectric constant,
$\varepsilon_d$: Material dielectric constant of the topmost dielectric layer,
I: Coupling current,
v: input voltage,
t: Time.

In a comparative embodiment, if the distance (or gap) "d" is very much less than a square root of the antenna area "A" (e.g., $d<<\sqrt{A}$), for example, the distance (or gap) "d" is 20 μm, and the antenna area "A" is 1 mm$^2$; thus, the antenna element may be very thin, and the semiconductor package structure may be very thin. However, the coupling capacitance (C) will be very large. Meanwhile, a large coupling current (I) will be generated simultaneously. Thus, the radiation performance of the antenna element and the electrical performance of the semiconductor package structure may be adversely affected.

In another comparative embodiment, if the distance (or gap) "d" is greater than a square root of the antenna area "A" (e.g., $d>\sqrt{A}$), for example, the antenna area "A" is 100 μm$^2$, and the distance (or gap) "d" is preferably equal to or greater than 2 mm to sufficiently reduce the coupling capacitance (C). Accordingly, the distance (or gap) "d" may be the greatest dimension of the antenna element. Since the distance (or gap) "d" is the thickness of the sandwiched portion of the topmost dielectric layer, and the thickness of the topmost dielectric layer is proportional to the thickness of the sandwiched portion, a total thickness of the semiconductor package structure may dramatically increase due to the greater distance "d".

The present disclosure addresses at least some of the above concerns and provides for a semiconductor assembly. The semiconductor assembly includes a wiring structure, a semiconductor die and an electronic element. The electronic element is disposed on a surface of the wiring structure, and includes a first metal layer, a second metal layer substantially perpendicular to the surface of the wiring structure. Accordingly, a distance between the first metal layer and the second metal layer may not affect a total thickness of the semiconductor assembly. Some embodiments of the present disclosure further provides for a method for manufacturing the semiconductor assembly.

FIG. 1 illustrates a cross-sectional view of a semiconductor assembly 1 according to some embodiments of the present disclosure. The semiconductor assembly 1 may be a semiconductor package structure, and includes a wiring structure 2, a semiconductor die 3 and an electronic element 4.

The wiring structure 2 has a first surface 201 and a second surface 202 opposite to the first surface 201. The wiring structure 2 may include at least one circuit layer and at least one dielectric layer. For example, as shown in FIG. 1, the wiring structure 2 include a first circuit layer 21, a first dielectric layer 22, a second circuit layer 23, a second dielectric layer 24, a third circuit layer 25, a third dielectric layer 26, a fourth circuit layer 27, a fourth dielectric layer 28 and a fifth circuit layer 29.

The first circuit layer 21 and the first dielectric layer 22 may be a topmost circuit layer and a topmost dielectric layer of the wiring structure 2. The first circuit layer 21 is disposed adjacent to a top surface of the first dielectric layer 22. In some embodiments, the first circuit layer 21 is embedded in the first dielectric layer 22, and is exposed from the top surface of the first dielectric layer 22. In other embodiments, the first circuit layer 21 may be disposed on the top surface of the first dielectric layer 22. The first surface 201 of the wiring structure 2 may be the top surface of the first dielectric layer 22. A material of the first circuit layer 21 may include, for example, copper, another conductive metal, or an alloy thereof. A material of the first dielectric layer 22 may include an insulating material, a passivation material, a dielectric material or a solder resist material, such as, for example, a benzocyclobutene (BCB) based polymer or a polyimide (PI). In some embodiments, the first dielectric layer 22 may be made of a photoimageable material.

The second circuit layer 23 is disposed adjacent to a bottom surface of the first dielectric layer 22. In some embodiments, the second circuit layer 23 is disposed on the bottom surface of the first dielectric layer 22. In other embodiments, the second circuit layer 23 may be embedded in the first dielectric layer 22. A portion (e.g., via portion) of the second circuit layer 23 extends through the first dielectric layer 22 to electrically connect the first circuit layer 21. The second circuit layer 23 may include a seed layer 231 and a conductive layer 232. A material of the seed layer 231 may be titanium, copper, another metal or an alloy. In some embodiments, the seed layer 231 includes a titanium layer and a copper layer. A material of the conductive layer 232 may include, for example, copper, another conductive metal, or an alloy thereof. The second dielectric layer 24 is disposed on the first dielectric layer 22 and covers the second circuit layer 23. A material of the second dielectric layer 24 may be the same as or similar to the material of the first dielectric layer 22.

Similarly, the third circuit layer 25 is disposed adjacent to a bottom surface of the second dielectric layer 24. In some embodiments, the third circuit layer 25 is disposed on the bottom surface of the second dielectric layer 24. In other embodiments, the third circuit layer 25 may be embedded in the second dielectric layer 24. A portion (e.g., via portion) of the third circuit layer 25 extends through the second dielectric layer 24 to electrically connect the second circuit layer 23. The third circuit layer 25 may also include a seed layer 251 and a conductive layer 252. The third dielectric layer 26 is disposed on the second dielectric layer 24 and covers the third circuit layer 25. The fourth circuit layer 27 is disposed adjacent to a bottom surface of the third dielectric layer 26, and a portion (e.g., via portion) of the fourth circuit layer 27 extends through the third dielectric layer 26 to electrically connect the third circuit layer 25. The fourth circuit layer 27 may also include a seed layer 271 and a conductive layer 272. The fourth dielectric layer 28 is disposed on the third dielectric layer 26 and covers the fourth circuit layer 27. The fifth circuit layer 29 is disposed adjacent to a bottom surface of the fourth dielectric layer 28, and a portion (e.g., via portion) of the fifth circuit layer 29 extends through the fourth dielectric layer 28 to electrically connect the fourth circuit layer 27. The fifth circuit layer 29 may also include a seed layer 291 and a conductive layer 292. Materials of the third circuit layer 25, the fourth circuit layer 27 and the fifth circuit layer 29 may be similar to the material of the second circuit layer 23, and material of the third dielectric layer 26 and the fourth dielectric layer 28 may be similar to the material of the first dielectric layer 22 and/or the second dielectric layer 24. A plurality of solder balls 14 is disposed on a bottommost circuit layer (e.g., the fifth circuit layer 29) of the wiring structure 2 for external connection purpose.

The semiconductor die 3 is disposed on the first surface 201 of the wiring structure 2. The semiconductor die 3 may include a plurality of bumps 31 electrically connected to the topmost circuit layer (e.g., the first circuit layer 21) through a plurality of solders 32 disposed therebetween. An underfill 33 is disposed between the semiconductor die 3 and the first surface 201 of the wiring structure 2 to cover and protect the bumps 31 and the solders 32.

The electronic element 4 is electrically connected to the wiring structure 2, such as the first circuit layer 21 of the wiring structure 2. That is, the semiconductor die 3 and the electronic element 4 are electrically connected to a same circuit layer (e.g., the first circuit layer 21) of the wiring structure 2. Further, the semiconductor die 3 and the electronic element 4 may be disposed side by side. In some embodiments, the electronic element 4 may be an antenna element such as a path antenna. As shown in FIG. 1, the electronic element 4 is disposed on the first surface 201 of the wiring structure 2. The electronic element 4 may be adhered to the first surface 201 of the wiring structure 2 through an adhesive layer 47 disposed therebetween. The electronic element 4 includes a first metal layer 41, a second metal layer 42 and a dielectric material 43 interposed between the first metal layer 41 and the second metal layer 42, which is like a sandwich structure. The first metal layer 41 and the second metal layer 42 are disposed on two opposite surfaces of the dielectric material 43, and are parallel with each other. As shown in FIG. 1, the first metal layer 41 and the second metal layer 42 may be substantially perpendicular to the first surface 201 of the wiring structure 2. Thus, a bottom end of the first metal layer 41 and a bottom end of the second metal layer 42 may be attached to the first surface 201 of the wiring structure 2 by, for example, the adhesive layer 47. In some embodiments, the first metal layer 41 and the second metal layer 42 may be substantially perpendicular to the top surface of the first dielectric layer 22. Thus, a bottom end of the first metal layer 41 and a bottom end of the second metal layer 42 may be attached to the top surface of the first dielectric layer 22 by, for example, the adhesive layer 47. As shown in FIG. 1, one of the first metal layer 41 and the second metal layer 42 may face the semiconductor die 3.

The first metal layer 41 may include a seed layer 411 and a conductive layer 412. The second metal layer 42 may also include a seed layer 421 and a conductive layer 422. Materials of the seed layers 411 and 421 may be titanium, copper, another metal or an alloy. In some embodiments, the seed layers 411 and 421 each include a titanium layer and a copper layer. Materials of the conductive layers 412 and 422 may include, for example, copper, another conductive metal, or an alloy thereof.

The dielectric material 43 is interposed between the first metal layer 41 and the second metal layer 42, and a thickness T of the dielectric material 43 is defined as a distance or a gap between the first metal layer 41 and the second metal layer 42 measured along a direction substantially parallel to the first surface 201 of the wiring structure 2. In some embodiments, the dielectric material 43 may have a low dielectric constant (Dk) and/or a low dissipation factor (Df). For example, the dielectric constant (Dk) of the dielectric material 43 may be less than 5 F/m or less than 3 F/m. The dissipation factor (Df) of the dielectric material 43 may be less than $10^{-2}$, or less than $10^{-3}$. Thus, in order to achieve a predetermined radiation performance of the electronic element 4, the thickness T of the dielectric material 43 may increase corresponding to an increased frequency. In addition, if the thickness T of the dielectric material 43 is large enough, an undesired coupling capacitance and an undesired coupling current may not occur. Thus, the radiation performance of the antenna element 4 and the electrical performance of the semiconductor assembly may not be affected. In some embodiments, the dielectric material 43 may have a high dielectric constant (Dk) and/or a high dissipation factor (Df).

As shown FIG. 1, since the first metal layer 41 and the second metal layer 42 are substantially perpendicular to the first surface 201 of the wiring structure 2, a thickness of the dielectric material 43 may be substantially parallel to the first surface 201 of the wiring structure 2. Accordingly, a total thickness of the assembly 1 may not be affected by the thickness T of the dielectric material 43. That is, the total thickness of the semiconductor assembly 1 may not increase according to an increase of the thickness T of the dielectric material 43, so that a large thickness T of the dielectric material 43 may not result in a large total thickness of the semiconductor assembly 1. Besides, since the first metal layer 41 and the second metal layer 42 are not embedded in the wiring structure 2, the pattern of the first metal layer 42 and/or the pattern of the second metal layer 43 may be trimmed even if the electronic element 4 is already formed and disposed on the wiring structure 2. For example, the first metal layer 42 and/or the second metal layer 43 can tested and then be trimmed by a laser beam with an incident direction substantially parallel to the first surface 201 of the wiring structure 2.

Figure 2:
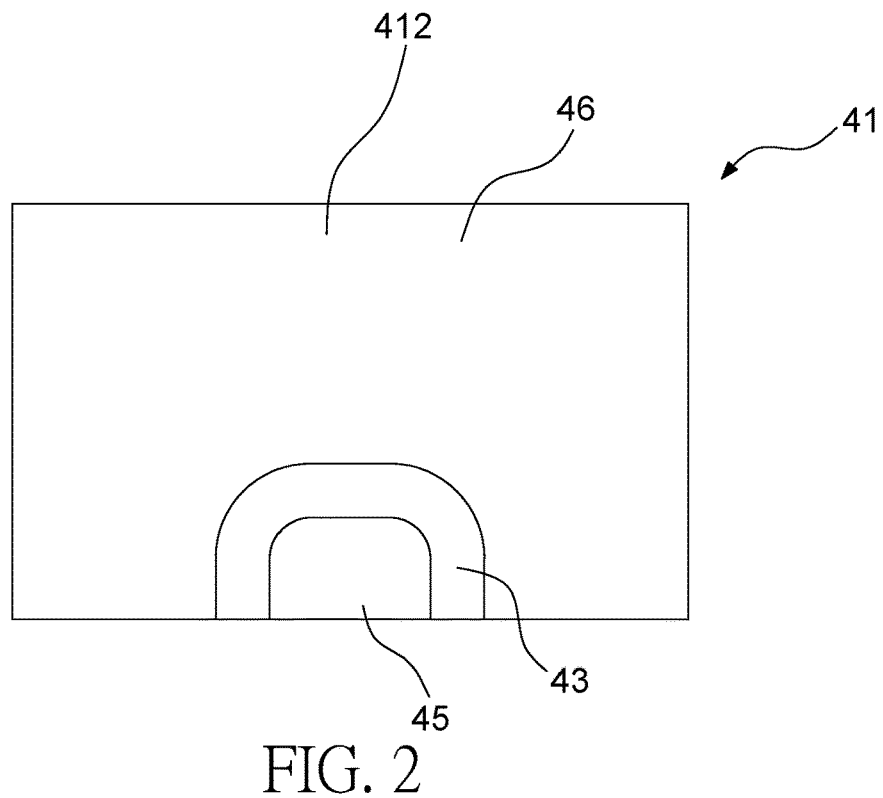
FIG. 2 illustrates a left side view of the electronic element of FIG. 1.

FIG. 2 illustrates a left side view of the electronic element 4 of FIG. 1. In some embodiments, the first metal layer 41 may include a feed portion 45 and a ground portion 46. The ground portion 46 may be isolated or separated from the feed portion 45. For example, the ground portion 46 may surround the feed portion 45 but may not contact the feed portion 45. The feed portion 45 may couple with the second metal layer 42, and the ground portion 46 may serve for grounding purpose. As shown in FIG. 1, the feed portion 45 is electrically connected to the first circuit layer 21 of the wiring structure 2 through a solder 44 connected therebetween. In some embodiments, the ground portion 46 may also be connected to the first circuit layer 21 of the wiring structure 2 through another solder (not shown).

Figure 3:
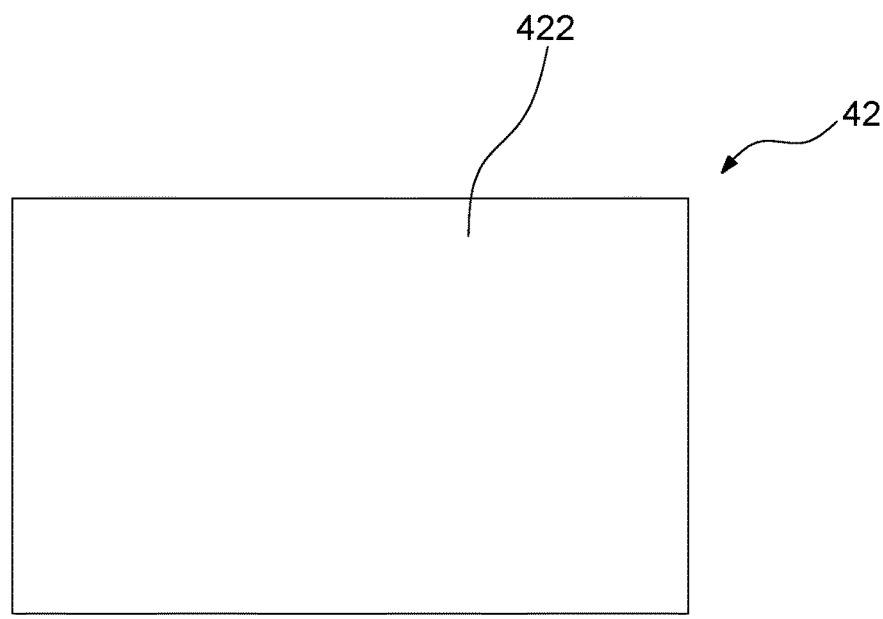
FIG. 3 illustrates a right side view of the electronic element of FIG. 1.

FIG. 3 illustrates a right side view of the electronic element 4 of FIG. 1. As shown in FIG. 3, the second metal layer 42 may occupies an entire surface of the dielectric material 43. That is, the second metal layer 42 is a solid or complete plate structure.

Figure 4:
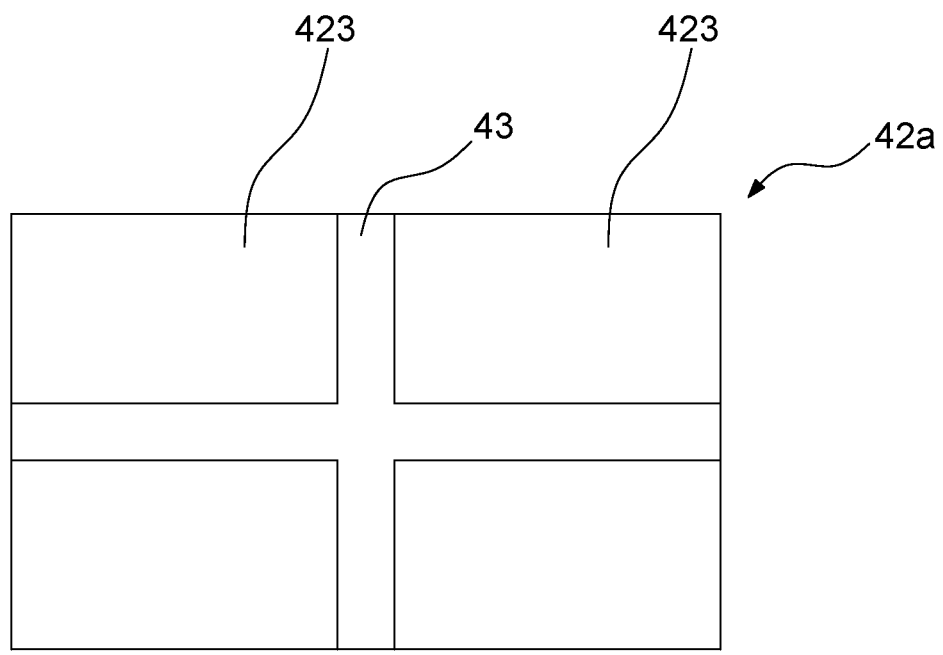
FIG. 4 illustrates a right side view of an electronic element according to some embodiments of the present disclosure.

FIG. 4 illustrates a right side view of an electronic element according to some embodiments of the present disclosure. The second metal layer 42a is similar to the second metal layer 42 shown in FIG. 3, except for their patterns. As shown in FIG. 4, the second metal layer 42 may include several blocks 423 arranged in an array. The blocks 423 may be isolated or separated from each other. It is noted that the second metal layers 42, 42a may have other pattern(s), which are not limited in the present disclosure.

Figure 5:
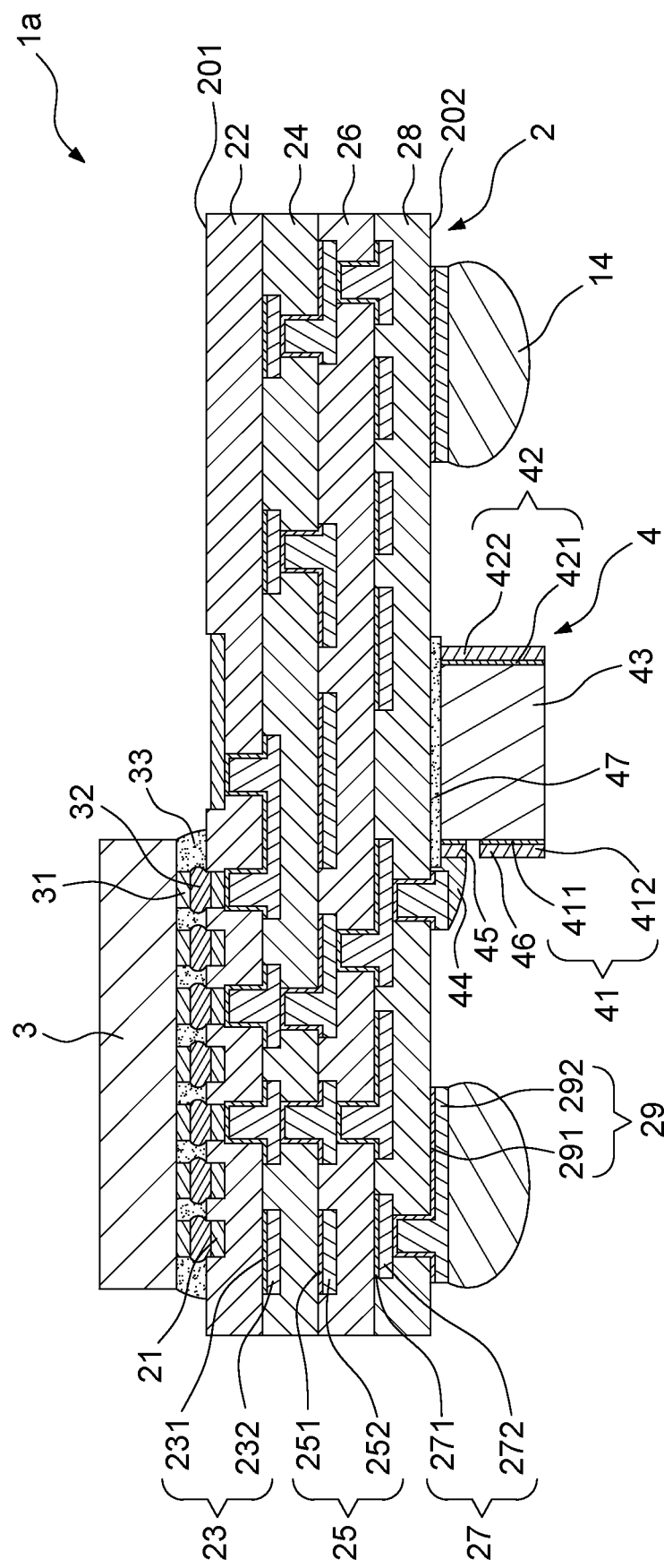
FIG. 5 illustrates a cross-sectional view of an example of a semiconductor assembly according to some embodiments of the present disclosure.

FIG. 5 illustrates a cross-sectional view of a semiconductor assembly 1a according to some embodiments of the present disclosure. The semiconductor assembly 1a is similar to the semiconductor assembly 1 shown in FIG. 1, except for the arrangement of the electronic element 4.

Similar to the semiconductor assembly 1 shown in FIG. 1, the wiring structure 2 in the semiconductor assembly 1a also has the first surface 201 and the second surface 202 opposite to the first surface 201. The semiconductor die 3 is disposed on the first surface 201 of the wiring structure 2. However, the electronic element 4 is disposed on the second surface 202 of the wiring structure 2, and is connected to a bottom-most circuit layer (e.g., the fifth circuit layer 29) of the wiring structure 2. As shown in FIG. 5, the first metal layer 41 and the second metal layer 42 may be substantially perpendicular to the second surface 202 of the wiring structure 2. In addition, the feed portion 45 is electrically connected to the bottommost circuit layer (e.g., the fifth circuit layer 29) of the wiring structure 2 through the solder 44 connected therebetween. Further, the first metal layer 41 and the second metal layer 42 may face the solder balls 14.

Figure 6:
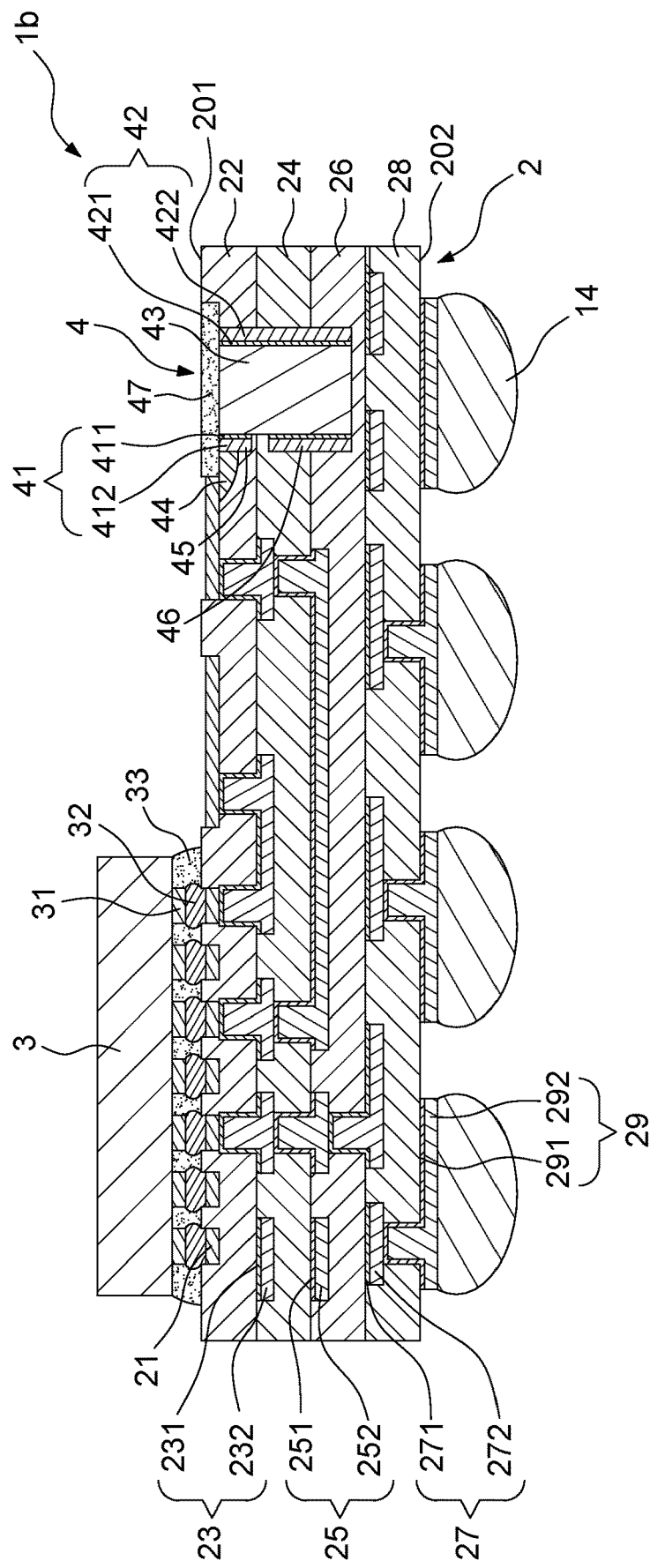
FIG. 6 illustrates a cross-sectional view of an example of a semiconductor assembly according to some embodiments of the present disclosure.

FIG. 6 illustrates a cross-sectional view of a semiconductor assembly 1b according to some embodiments of the present disclosure. The semiconductor assembly 1b is similar to the semiconductor assembly 1 shown in FIG. 1, except for the arrangement of the electronic element 4.

As shown in FIG. 6, the electronic element 4 is embedded in the wiring structure 2. The electronic element 4 is connected to the first circuit layer 21 of the wiring structure 2. That is, the semiconductor die 3 and the electronic element 4 are electrically connected to a same circuit layer (e.g., the first circuit layer 21) of the wiring structure 2. The first metal layer 41 of the electronic element 4 may contact several dielectric layers of the wiring structure 2. For example, as shown in FIG. 6, the first metal layer 41 contacts at least three dielectric layers (e.g, the first dielectric layer 22, the second dielectric layer 24 and the third dielectric layer 26) of the wiring structure 2. The second metal layer 42 of the electronic element 4 may also contact several dielectric layers of the wiring structure 2, such as at least three dielectric layers (e.g, the first dielectric layer 22, the second dielectric layer 24 and the third dielectric layer 26) of the wiring structure 2. The first metal layer 41 and the second metal layer 42 may contact the same dielectric layers (e.g., the first dielectric layer 22, the second dielectric layer 24 and the third dielectric layer 26) of the wiring structure 2. As shown in FIG. 6, the electronic element 4 may be adhered to the adhesive layer 47, and the adhesive layer 47 may be exposed on the first surface 201 of the wiring structure 2.

In the semiconductor assembly 1b shown in FIG. 6, since the electronic element 4 is embedded in the wiring structure 2, a total thickness of the semiconductor assembly 1b may be reduced.

Figure 7:
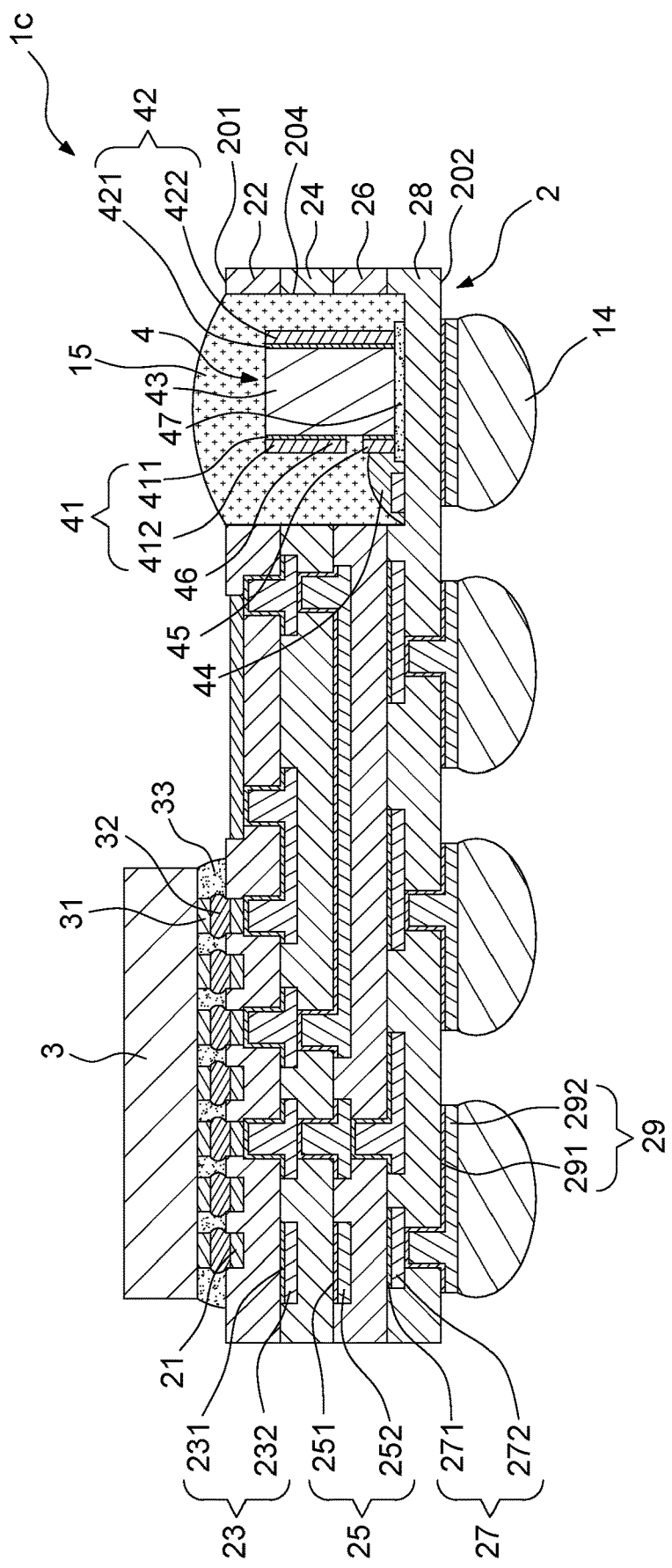
FIG. 7 illustrates a cross-sectional view of an example of a semiconductor assembly according to some embodiments of the present disclosure.

FIG. 7 illustrates a cross-sectional view of a semiconductor assembly 1c according to some embodiments of the present disclosure. The semiconductor assembly 1c is similar to the semiconductor assembly 1 shown in FIG. 1, except for the arrangement of the electronic element 4.

As shown in FIG. 7, the first wiring structure 2 defines a cavity 204 recessed from the first surface 201 of the wiring structure 2. For example, several dielectric layers (e.g., the first dielectric layer 22, the second dielectric layer 24, the third dielectric layer 26 and the fourth dielectric layer 28) jointly define the cavity 204. The electronic element 4 is disposed in the cavity 204. The cavity 204 exposes a circuit layer (e.g., the fourth circuit layer 27) of the wiring structure 2, and the electronic element 4 is electrically connected to the exposed circuit layer (e.g., the fourth circuit layer 27). A filling material 15 may be disposed in the cavity 204 and may cover the electronic element 4. As shown in FIG. 7, the filling material 15 may fill the cavity 204 and may cover the electronic element 4.

Figure 8:
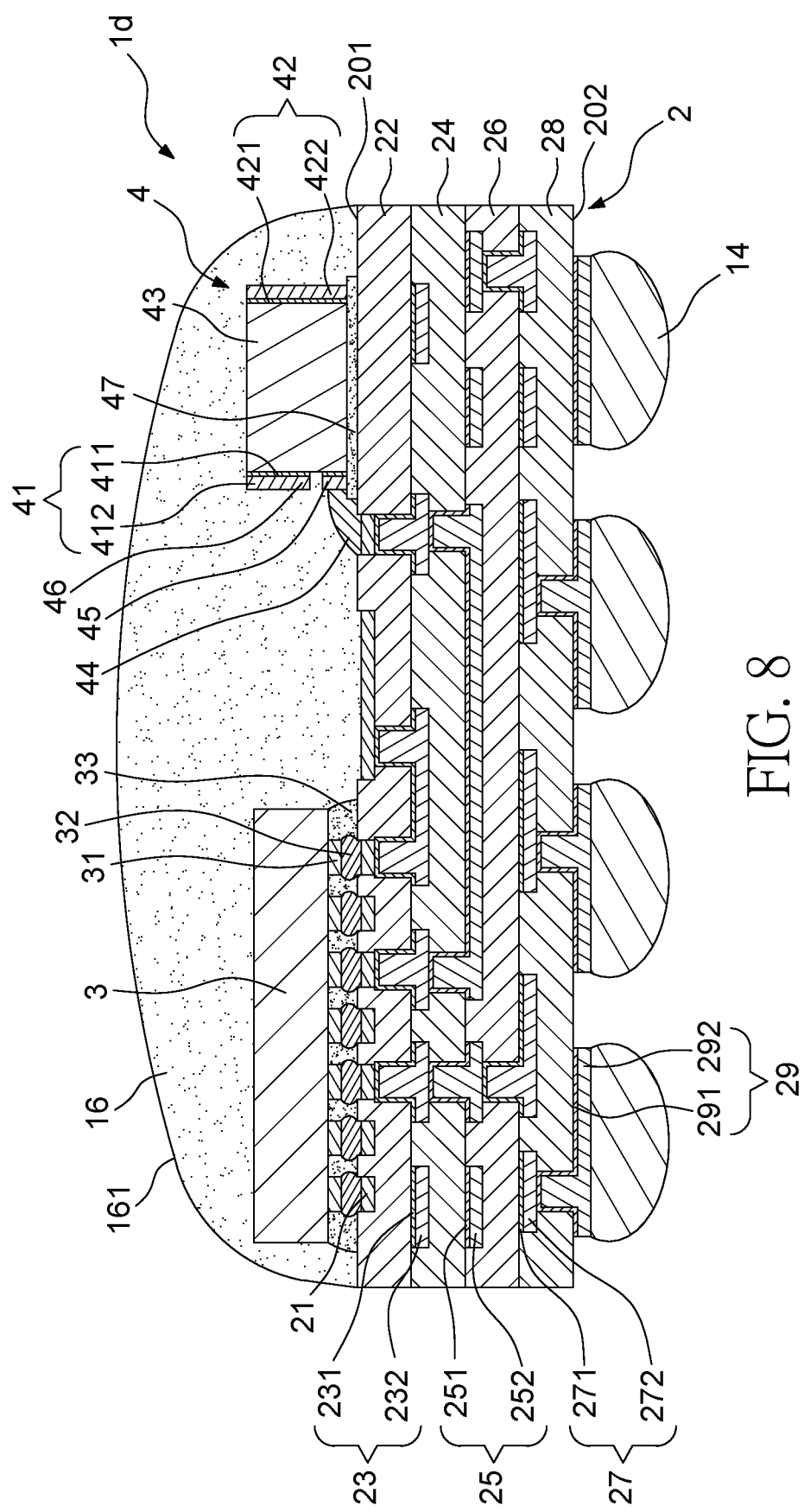
FIG. 8 illustrates a cross-sectional view of an example of a semiconductor assembly according to some embodiments of the present disclosure.

FIG. 8 illustrates a cross-sectional view of a semiconductor assembly 1d according to some embodiments of the present disclosure. The semiconductor assembly 1d is similar to the semiconductor assembly 1 shown in FIG. 1, except that the semiconductor assembly 1d further includes an encapsulant 16.

As shown in FIG. 8, the encapsulant 16 is disposed on the wiring structure 2, such as on the first surface 201 of the wiring structure 2. The encapsulant 16 covers the electronic element 4, and may further cover the semiconductor die 3. The encapsulant 16 has a curved surface 161. The curved surface 161 may enhance the radiation performance of the electronic element 4.

Figure 9:
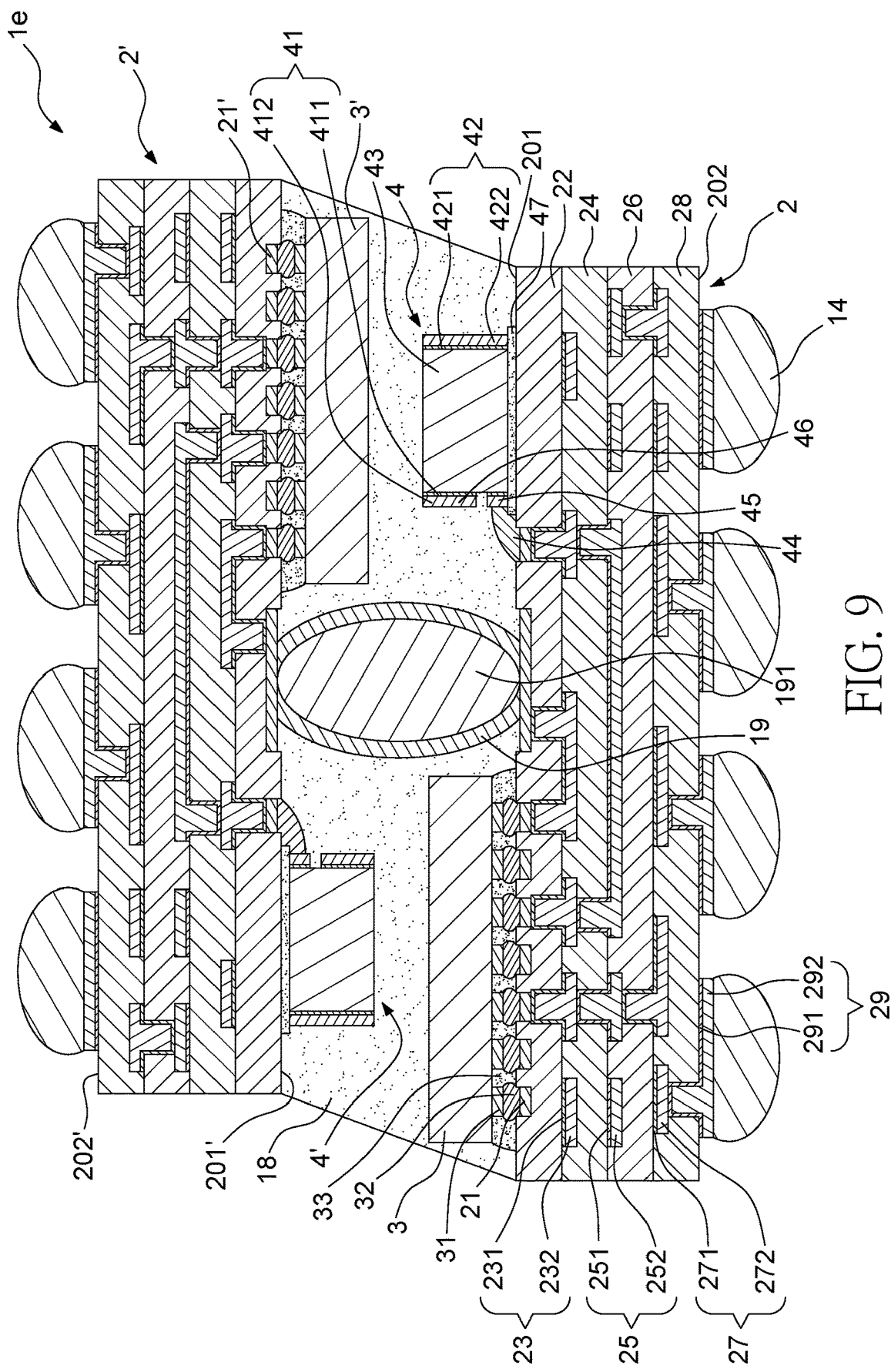
FIG. 9 illustrates a cross-sectional view of an example of a semiconductor assembly according to some embodiments of the present disclosure.

FIG. 9 illustrates a cross-sectional view of a semiconductor assembly 1e according to some embodiments of the present disclosure. The semiconductor assembly 1e is similar to the semiconductor assembly 1 shown in FIG. 1, except that the semiconductor assembly 1e further includes an additional wiring structure 2', an additional semiconductor die 3', an additional electronic element 4', a solder connector 19 and an encapsulant 18.

As shown in FIG. 9, the semiconductor assembly 1e includes a first wiring structure 2, a first semiconductor die 3 and a first electronic element 4 similar to or same as the wiring structure 2, the semiconductor die 3 and the electronic element 4 of the semiconductor assembly 1 shown in FIG. 1, respectively. In addition, the semiconductor assembly 1e further includes a second wiring structure 2', a second semiconductor die 3', a second electronic element 4', a solder connector 19 and an encapsulant 18. The second wiring structure 2', the second semiconductor die 3' and the second electronic element 4' may be similar to or same as the first wiring structure 2, the first semiconductor die 3 and the first electronic element 4, respectively.

As shown in FIG. 9, the second wiring structure 2' also includes a first surface 201' and a second surface 202' opposite to the first surface 201'. The second semiconductor die 3' is disposed on the first surface 201' of the first wiring structure 2'. The second electronic element 3' 4' is also disposed on the first surface 201' of the second wiring structure 2'. As shown FIG. 9, the first surface 201' of the second wiring structure 2' faces the first surface 201 of the first wiring structure 2.

The second wiring structure 2' is disposed on and electrically connected to the first wiring structure 2 through the solder connector 19. The solder connector 19 contacts and electrically connects the first circuit layer 21' of the second wiring structure 2' and the first circuit layer 21 of the first wiring structure 2. The solder connector 19 may include a core 191. The encapsulant 18 is disposed between the first wiring structure 2 and the second wiring structure 2', such as between the first surface 201 of the first wiring structure 2 and the first surface 201' of the second wiring structure 2'. The encapsulant 18 may cover and protect the first semiconductor die 3, the first electronic element 4, the semiconductor die 3', the second electronic element 4' and the solder connector 19.

Figure 10:
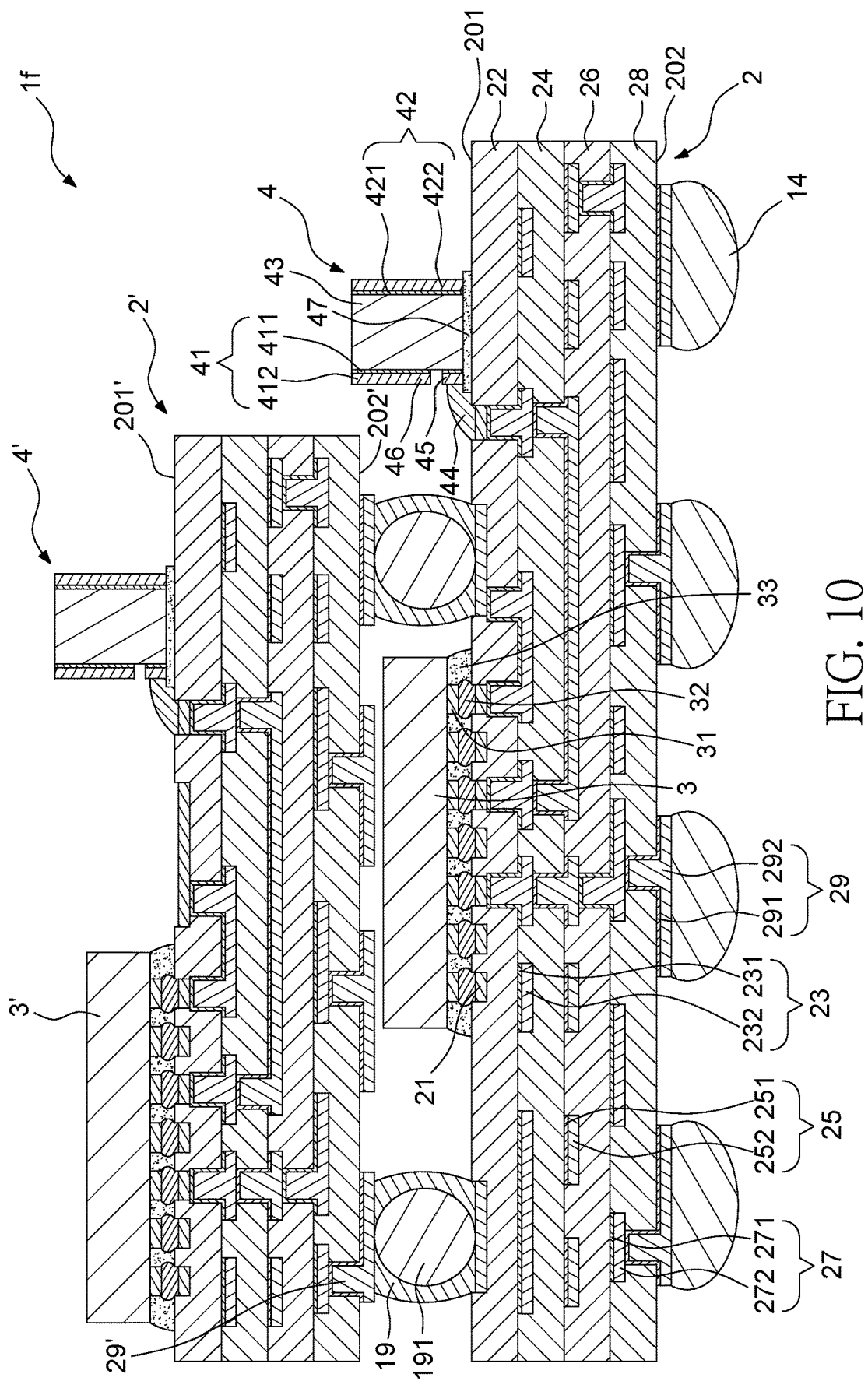
FIG. 10 illustrates a cross-sectional view of an example of a semiconductor assembly according to some embodiments of the present disclosure.

FIG. 10 illustrates a cross-sectional view of a semiconductor assembly if according to some embodiments of the present disclosure. The semiconductor assembly if is similar to the semiconductor assembly 1e shown in FIG. 9, except for the follows.

As shown in FIG. 10, the second surface 202' of the second wiring structure 2' faces the first surface 201 of the first wiring structure 2. The solder connector 19 contacts and electrically connects the fifth circuit layer 29' of the second wiring structure 2' and the first circuit layer 21 of the first wiring structure 2. The first electronic element 4 may extend beyond a horizontal level of the second surface 202' of the second wiring structure 2'.

Figure 11:
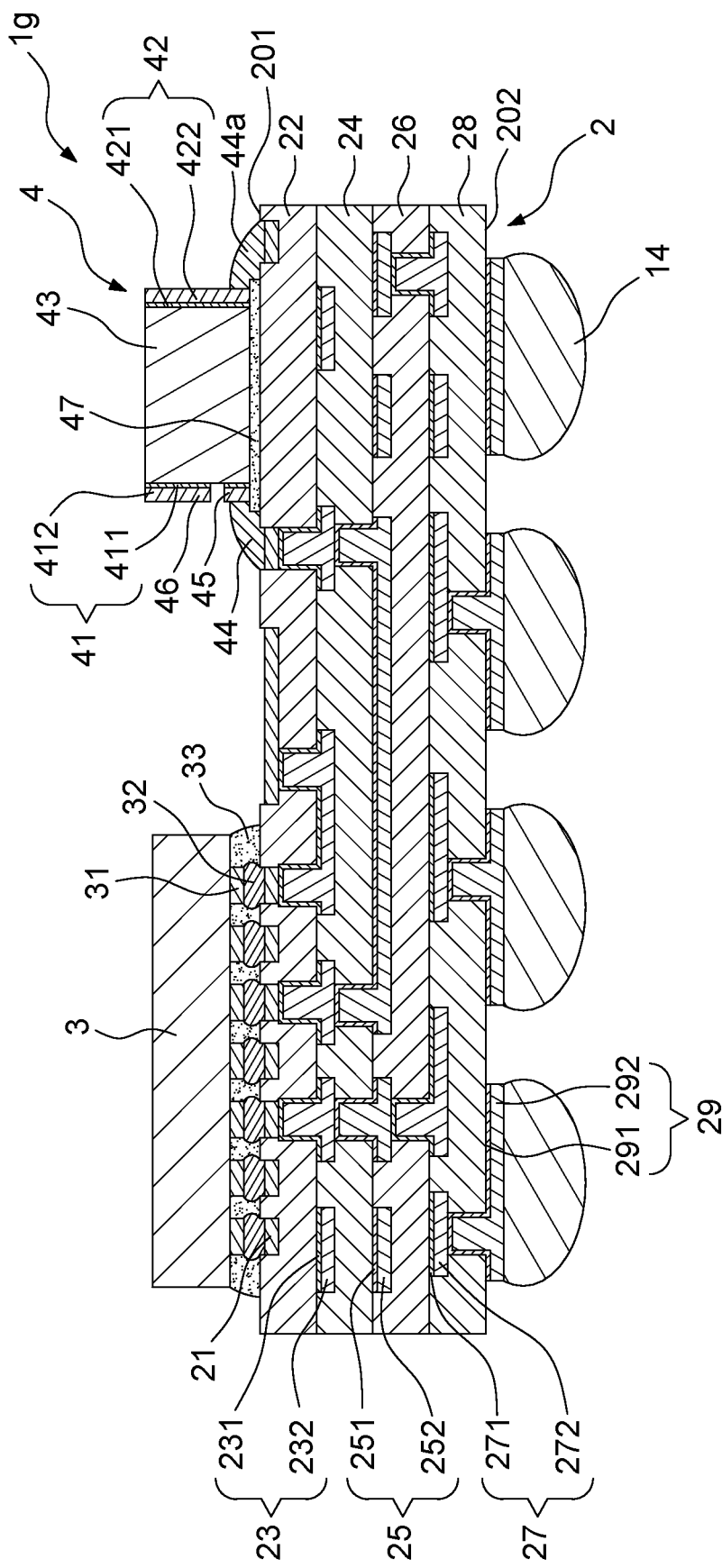
FIG. 11 illustrates a cross-sectional view of an example of a semiconductor assembly according to some embodiments of the present disclosure.

FIG. 11 illustrates a cross-sectional view of a semiconductor assembly 1g according to some embodiments of the present disclosure. The semiconductor assembly 1g is similar to the semiconductor assembly 1 shown in FIG. 1, except for the follows.

As shown in FIG. 11, the second metal layer 42 of the electronic element 4 is also connected to the wiring structure 2. For example, the second metal layer 42 is electrically connected to the first circuit layer 21 of the wiring structure 2 through a solder 44a connected therebetween. That is, the first metal layer 41 and the second metal layer 42 are electrically connected to a same circuit layer (e.g., the first circuit layer 21) of the wiring structure 2. In some embodiments, the second metal layer 42 may also include a feed portion, and may thus should be electrically connected to the wiring structure 2. As shown in FIG. 11, the semiconductor die 3 and the electronic element 4 are electrically connected to a topmost circuit layer (e.g., the first circuit layer 21) of the wiring structure 2.

Figure 12:
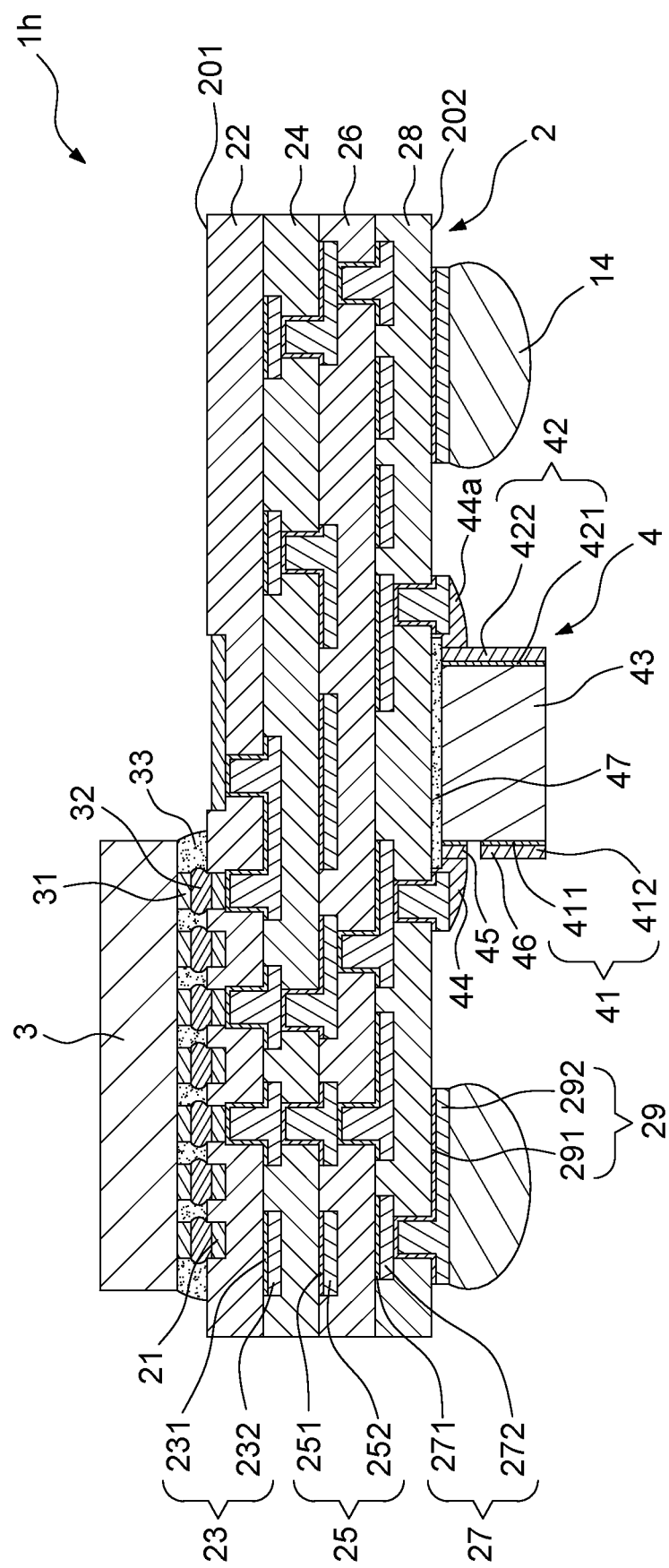
FIG. 12 illustrates a cross-sectional view of an example of a semiconductor assembly according to some embodiments of the present disclosure.

FIG. 12 illustrates a cross-sectional view of a semiconductor assembly 1h according to some embodiments of the present disclosure. The semiconductor assembly 1h is similar to the semiconductor assembly 1g shown in FIG. 11, except for the follows.

As shown in FIG. 12, the electronic element 4 is disposed on the second surface 202 of the wiring structure 2 and is electrically connected to the fifth circuit layer 29 of the wiring structure 2. Accordingly, the semiconductor die 3 is electrically connected to a topmost circuit layer (e.g., the first circuit layer 21) of the wiring structure 2, and the electronic element 4 is electrically connected to a bottommost circuit layer (e.g., the fifth circuit layer 29) of the wiring structure 2. In addition, the first metal layer 41 and the second metal layer 42 are electrically connected to a same circuit layer (e.g., the fifth circuit layer 29) of the wiring structure 2.

FIG. 13 through FIG. 32 illustrate a method for manufacturing a semiconductor assembly according to some embodiments of the present disclosure. In some embodiments, the method is for manufacturing a semiconductor assembly, such as the semiconductor assembly 1 shown in FIG. 1.

Figure 13:
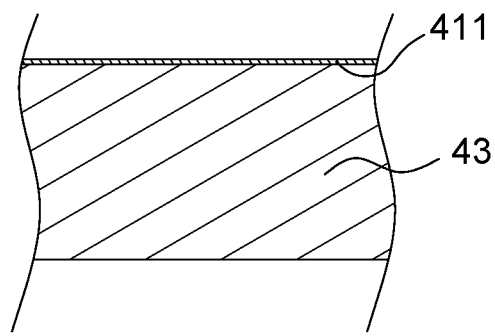
FIG. 13 illustrates one or more stages of an example of a method for manufacturing a semiconductor assembly according to some embodiments of the present disclosure.

Referring to FIG. 13, a dielectric material 43 is provided. Then, a seed layer 411 is disposed on the top surface of the dielectric material 43 by, for example, sputtering.

Figure 14:
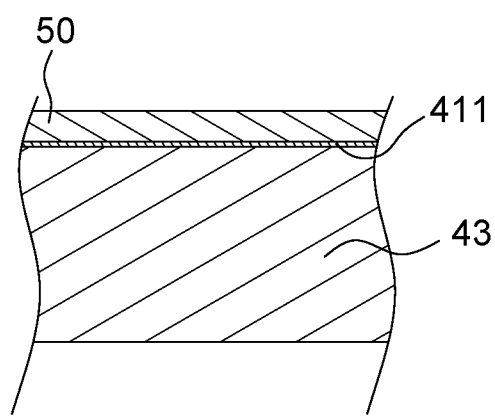
FIG. 14 illustrates one or more stages of an example of a method for manufacturing a semiconductor assembly according to some embodiments of the present disclosure.

Referring to FIG. 14, a photoresist 50 is disposed on the seed layer 411.

Figure 15:
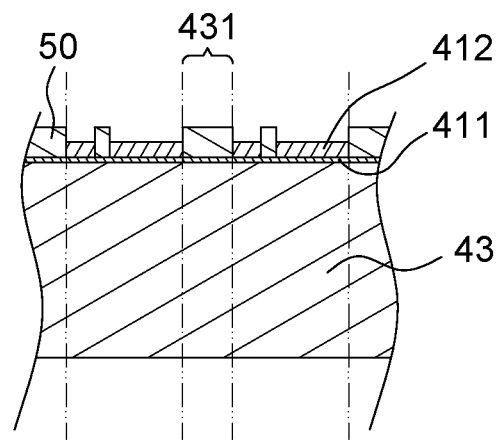
FIG. 15 illustrates one or more stages of an example of a method for manufacturing a semiconductor assembly according to some embodiments of the present disclosure.

Referring to FIG. 15, the photoresist 50 is patterned by, for example, exposure and development, to expose portions of the seed layer 411. Then, a conductive layer 412 is disposed on the exposed portions of the seed layer 411 by, for example, plating. As shown in FIG. 15, dielectric material 43 may include a plurality of sawing streets 431.

Figure 16:
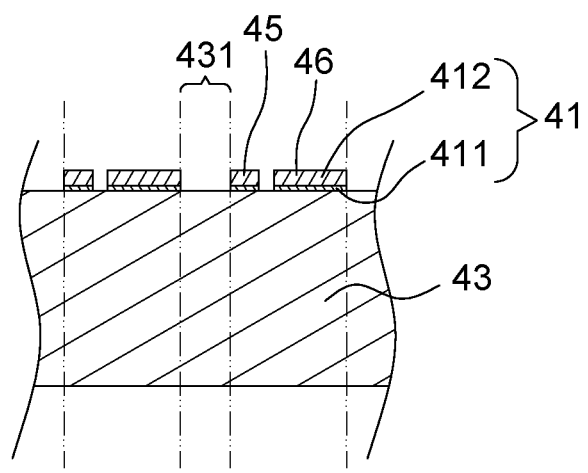
FIG. 16 illustrates one or more stages of an example of a method for manufacturing a semiconductor assembly according to some embodiments of the present disclosure.

Referring to FIG. 16, the photoresist 50 is removed. Then, portions of the seed layer 411 which are not covered by the conductive layer 412 are etched, thus forming a first metal layer 41 on the dielectric material 43. The first metal layer 41 may include a feed portion 45 and a ground portion 46.

Figure 17:
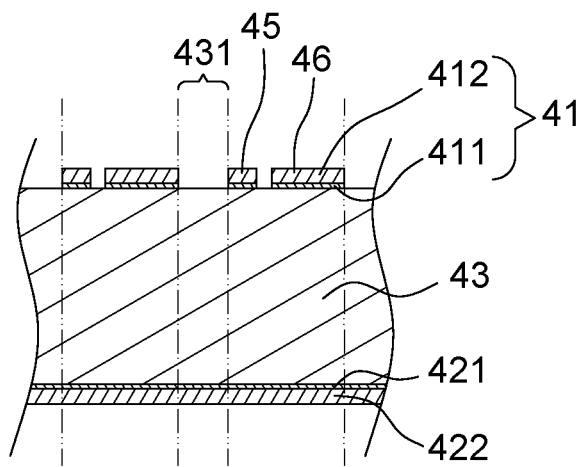
FIG. 17 illustrates one or more stages of an example of a method for manufacturing a semiconductor assembly according to some embodiments of the present disclosure.

Referring to FIG. 17, a seed layer 421 is disposed on the bottom surface of the dielectric layer 43 by, for example, sputtering. Then, a conductive layer 422 is disposed on the seed layer 421 by, for example, plating.

Figure 18:
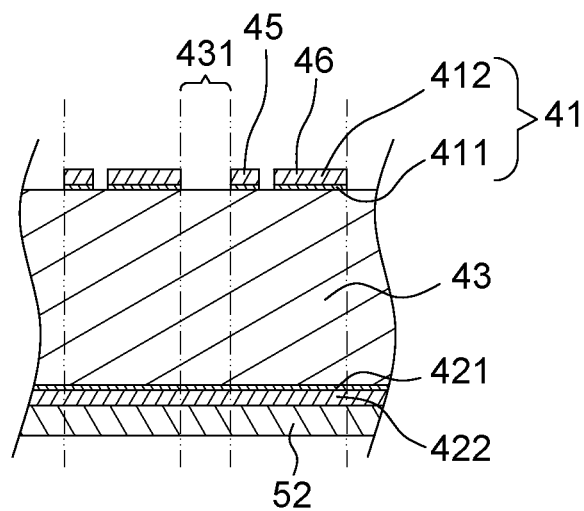
FIG. 18 illustrates one or more stages of an example of a method for manufacturing a semiconductor assembly according to some embodiments of the present disclosure.

Referring to FIG. 18, a photoresist 52 is disposed on the conductive layer 422.

Figure 19:
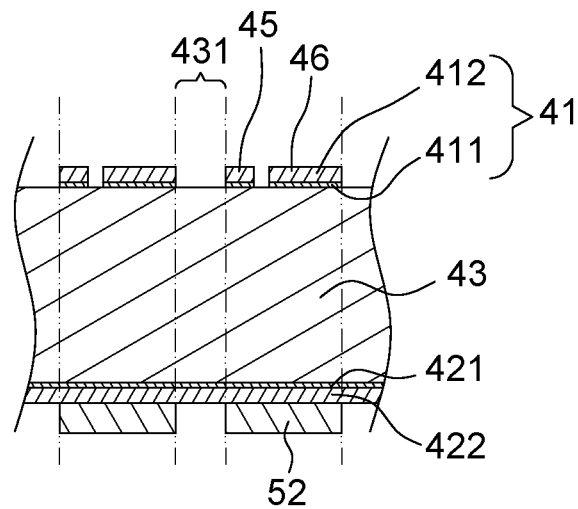
FIG. 19 illustrates one or more stages of an example of a method for manufacturing a semiconductor assembly according to some embodiments of the present disclosure.

Referring to FIG. 19, the photoresist 52 is patterned by, for example, exposure and development, to expose portions of the conductive layer 422. Formation of the patterned photoresist 52 may be similar to that of the photoresist 50.

Figure 20:
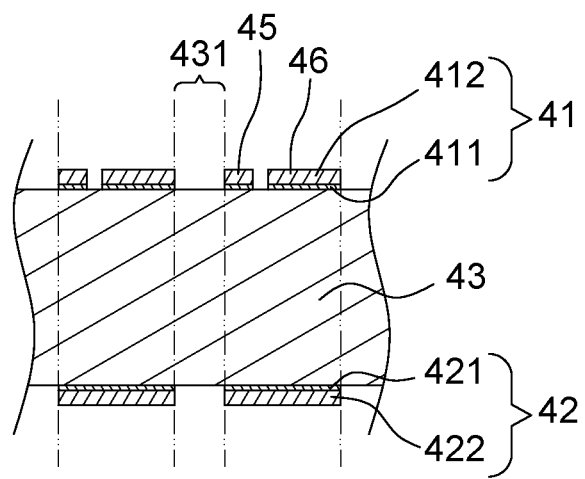
FIG. 20 illustrates one or more stages of an example of a method for manufacturing a semiconductor assembly according to some embodiments of the present disclosure.

Referring to FIG. 20, the exposed portions of the conductive layer 422 are etched with the patterned photoresist 52 serving as a mask. Then, the seed layer 421 corresponding to the exposed portions of the conductive layer 422 may also be etched, thus forming the second metal layer 42. The dielectric material 43 is interposed between the first metal layer 41 and the second metal layer 42. Then, the structure shown in FIG. 20 is singulated into a plurality of electronic elements (such as the electronic element 4 shown in FIG. 1) along the sawing streets 431. Accordingly, the electronic element 4 is provided and includes the first metal layer 41, the second metal layer 42 and the dielectric material 43 interposed between the first metal layer 41 and the second metal layer 42.

Figure 21:
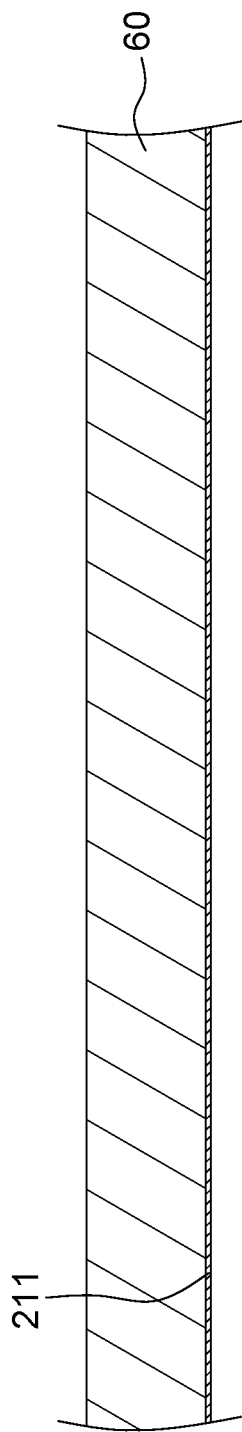
FIG. 21 illustrates one or more stages of an example of a method for manufacturing a semiconductor assembly according to some embodiments of the present disclosure.

Referring to FIG. 21, a carrier 60 is provided. Then, a seed layer 211 is disposed on the carrier 60 by, for example, sputtering.

Figure 22:
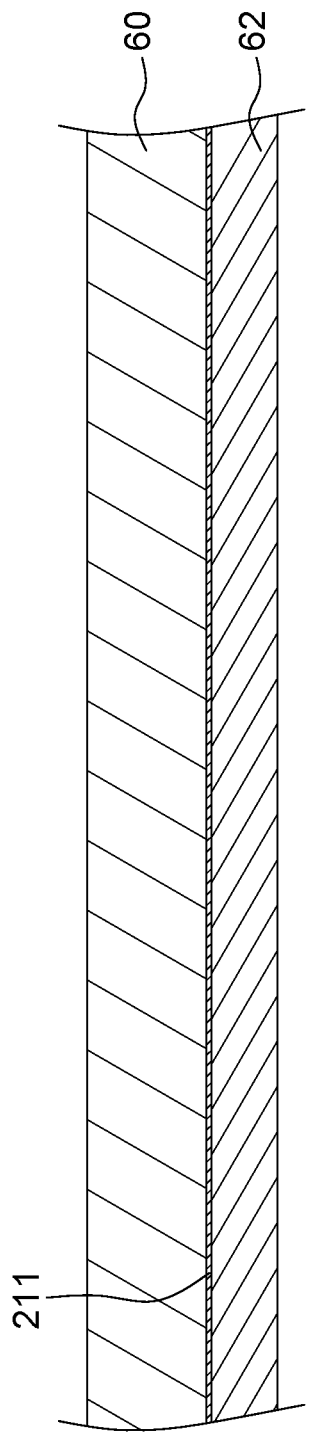
FIG. 22 illustrates one or more stages of an example of a method for manufacturing a semiconductor assembly according to some embodiments of the present disclosure.

Referring to FIG. 22, a photoresist 62 is disposed on the seed layer 211.

Figure 23:
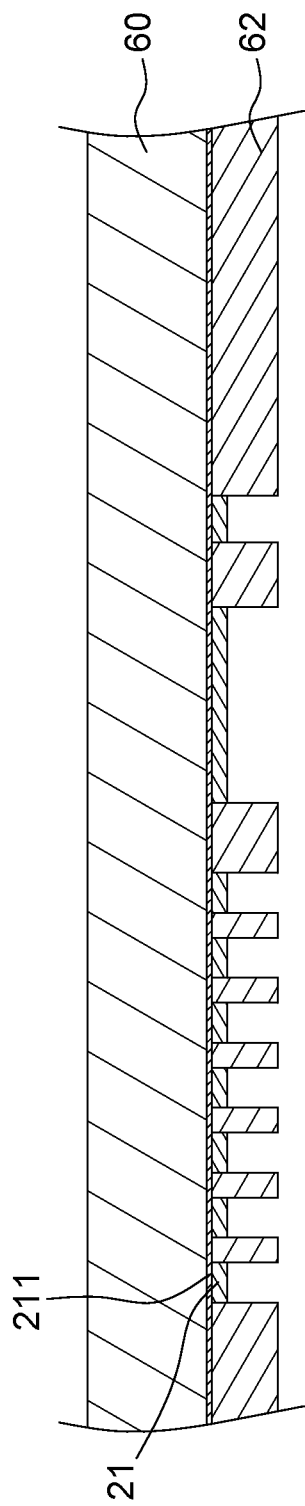
FIG. 23 illustrates one or more stages of an example of a method for manufacturing a semiconductor assembly according to some embodiments of the present disclosure.

Referring to FIG. 23, the photoresist 62 is patterned by, for example, exposure and development, to expose portions of the seed layer 211. Then, a first circuit layer 21 is disposed on the exposed portions of the seed layer 211 by, for example, plating.

Figure 24:
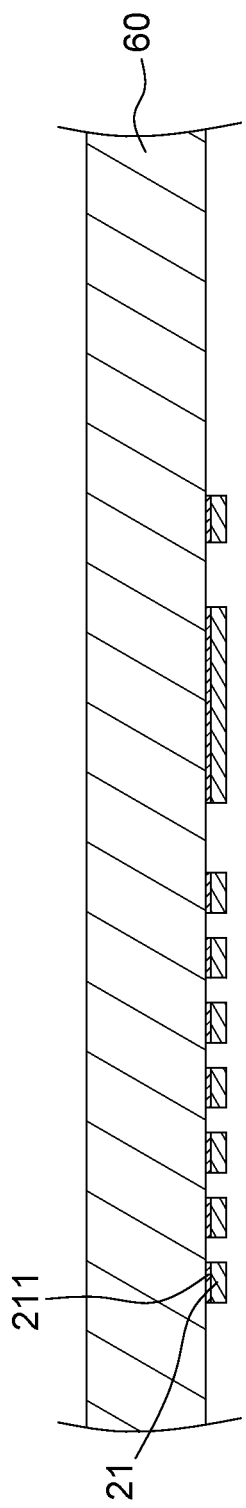
FIG. 24 illustrates one or more stages of an example of a method for manufacturing a semiconductor assembly according to some embodiments of the present disclosure.

Referring to FIG. 24, the photoresist 62 is removed. Then, portions of the seed layer 211 which are not covered by the first circuit layer 21 are removed by, for example, etching.

Figure 25:
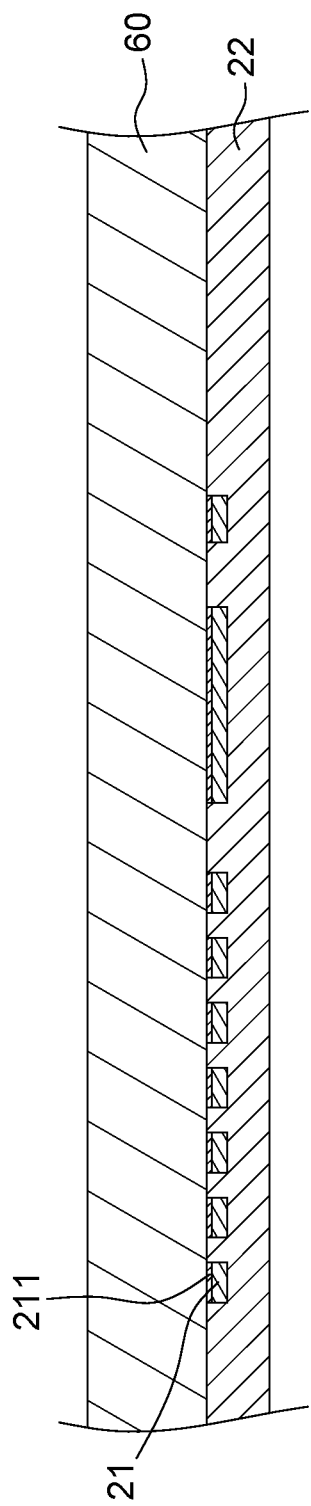
FIG. 25 illustrates one or more stages of an example of a method for manufacturing a semiconductor assembly according to some embodiments of the present disclosure.

Referring to FIG. 25, a first dielectric material 22 is disposed on the carrier 60 to cover the first circuit layer 21.

Figure 26:
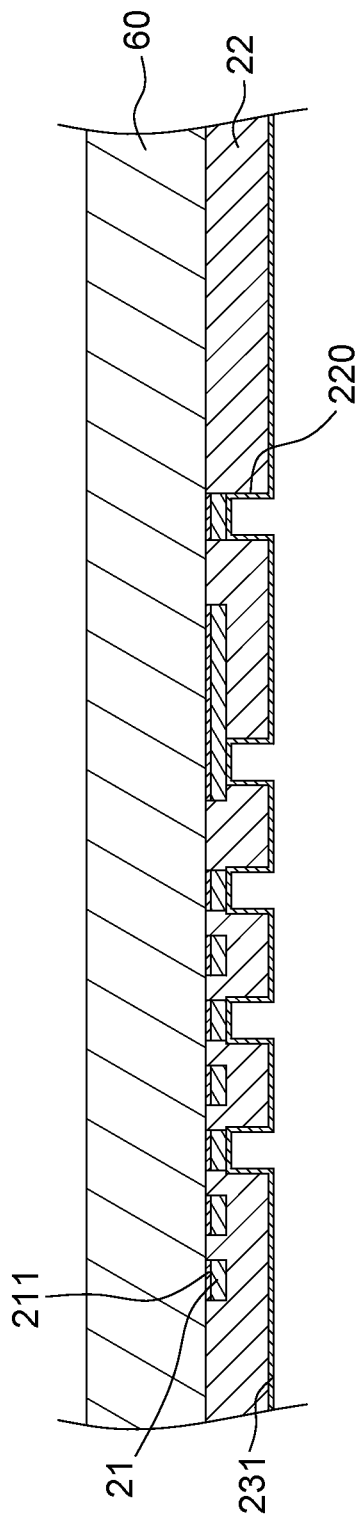
FIG. 26 illustrates one or more stages of an example of a method for manufacturing a semiconductor assembly according to some embodiments of the present disclosure.

Referring to FIG. 26, the first dielectric layer 22 is patterned by, for example, exposure and development. Accordingly, the first dielectric layer 22 defines openings 220 to expose portions of the first circuit layer 21. Then, a seed layer 231 is disposed on the first dielectric layer 22 and extends into the openings 220 of the dielectric layer 22 to contact the first circuit layer 21.

Figure 27:
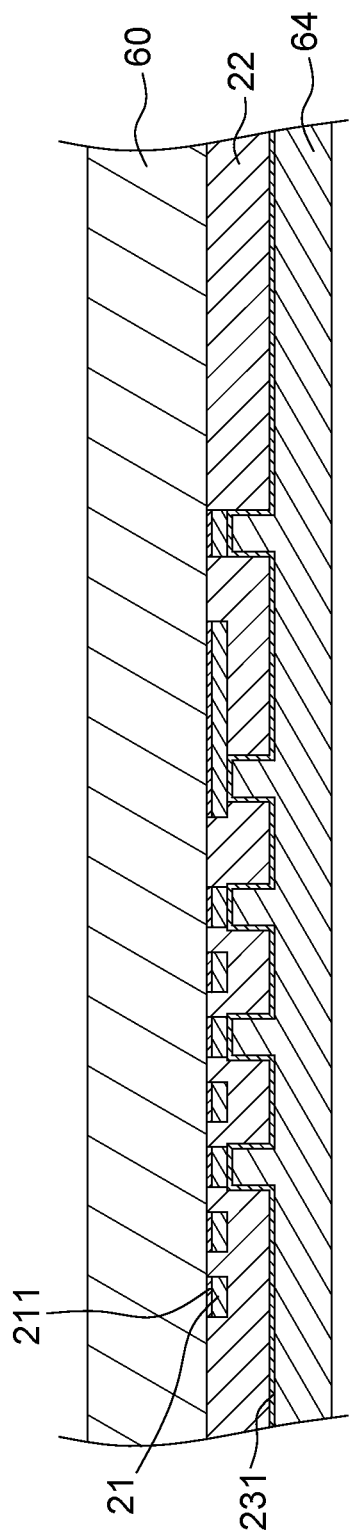
FIG. 27 illustrates one or more stages of an example of a method for manufacturing a semiconductor assembly according to some embodiments of the present disclosure.

Referring to FIG. 27, a photoresist 64 is disposed on the seed layer 231.

Figure 28:
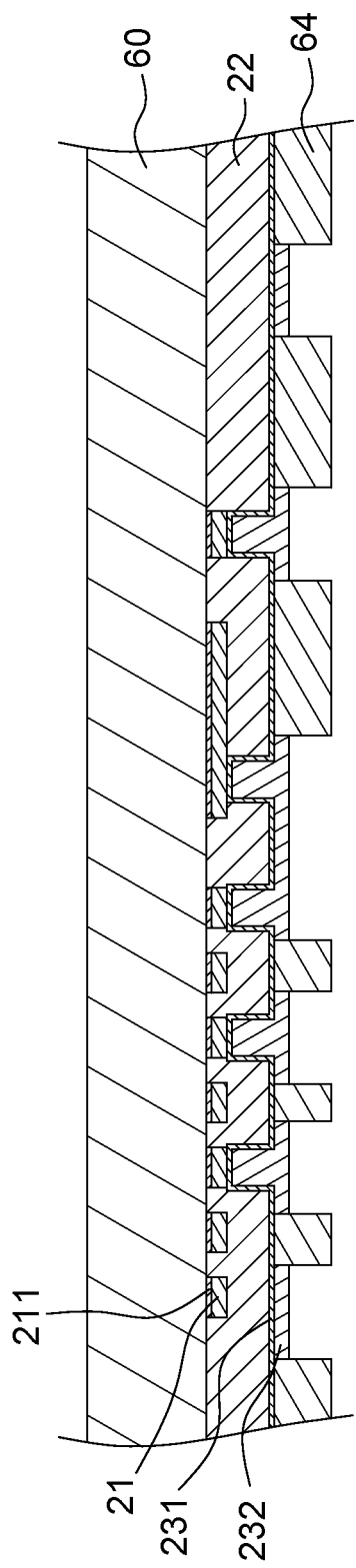
FIG. 28 illustrates one or more stages of an example of a method for manufacturing a semiconductor assembly according to some embodiments of the present disclosure.

Referring to FIG. 28, the photoresist 64 is patterned by, for example, exposure and development, to expose portions of the seed layer 231. Then, a conductive layer 232 is disposed on the exposed portions of the seed layer 231 by, for example, plating.

Figure 29:
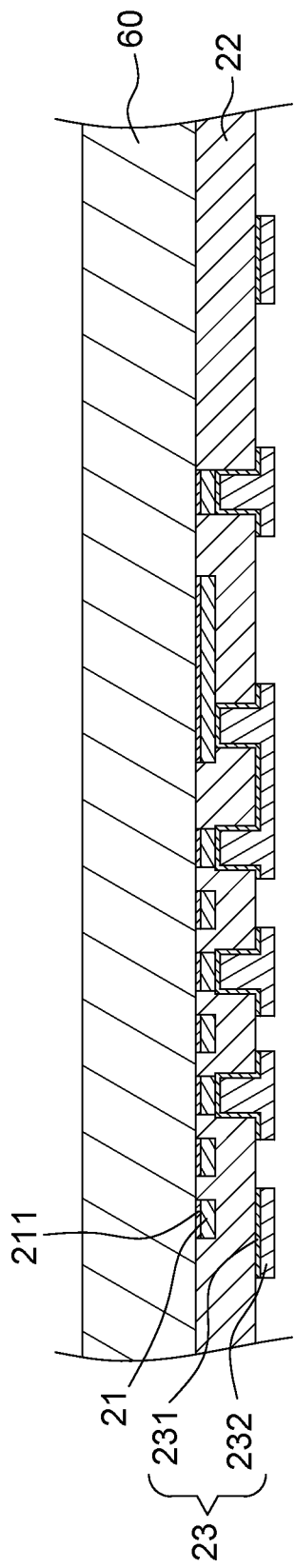
FIG. 29 illustrates one or more stages of an example of a method for manufacturing a semiconductor assembly according to some embodiments of the present disclosure.

Referring to FIG. 29, the photoresist 64 is removed. Then, portions of the seed layer 231 which are not covered by the second circuit layer 232 are removed by, for example, etching, thus forming a second circuit layer 23.

Figure 30:
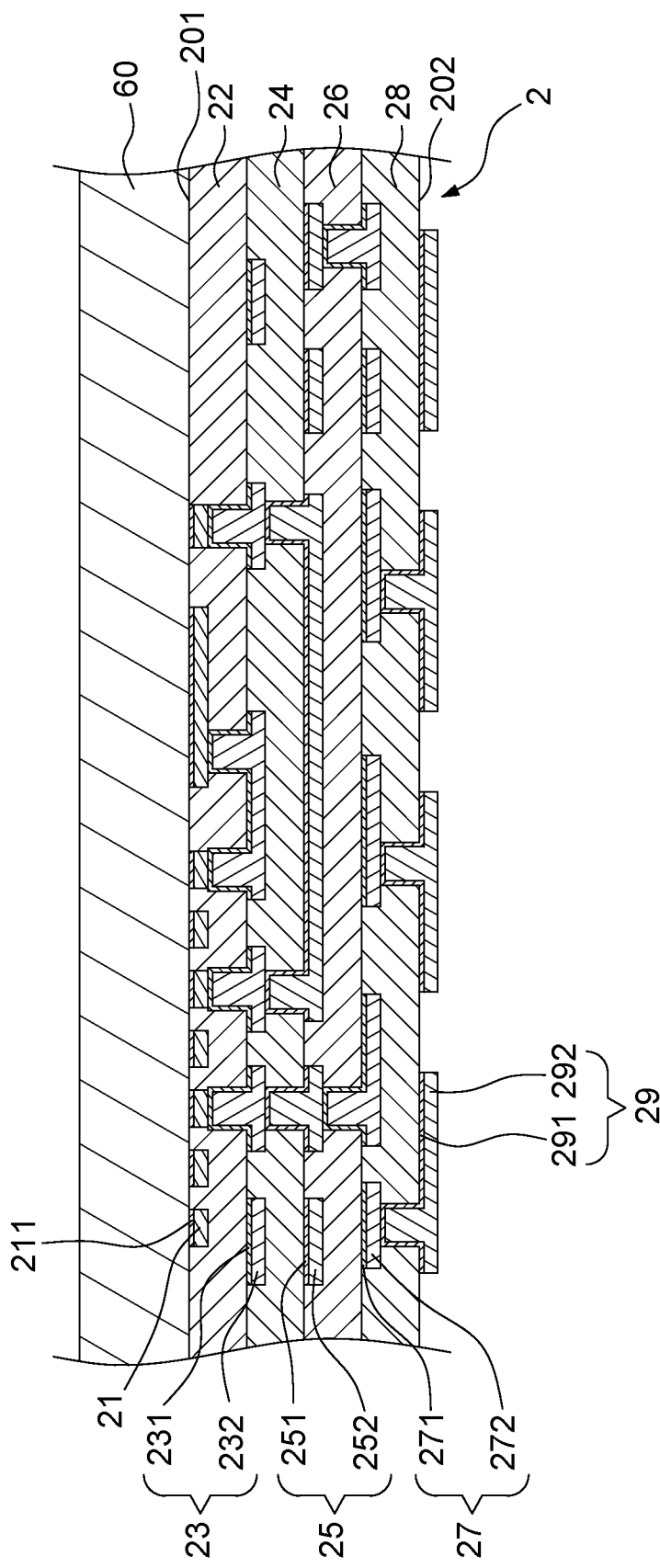
FIG. 30 illustrates one or more stages of an example of a method for manufacturing a semiconductor assembly according to some embodiments of the present disclosure.

Referring to FIG. 30, stages similar to those shown in FIGS. 25 to 29 are conducted to form a second dielectric layer 24, a third circuit layer 25, a third dielectric layer 26, a fourth circuit layer 27, a fourth dielectric layer 28 and a fifth circuit layer 29 sequentially disposed on the first dielectric layer 22 and the second circuit layer 23. Accordingly, a wiring structure 2 is formed or provided. The wiring structure 2 includes the first circuit layer 21, the first dielectric layer 22, the second circuit layer 23, the second dielectric layer 24, the third circuit layer 25, the third dielectric layer 26, the fourth circuit layer 27, the fourth dielectric layer 28 and the fifth circuit layer 29. The wiring structure 2 has a first surface 201 and a second surface 202 opposite to the first surface 201. The first surface 201 may contact the carrier 60.

Figure 31:
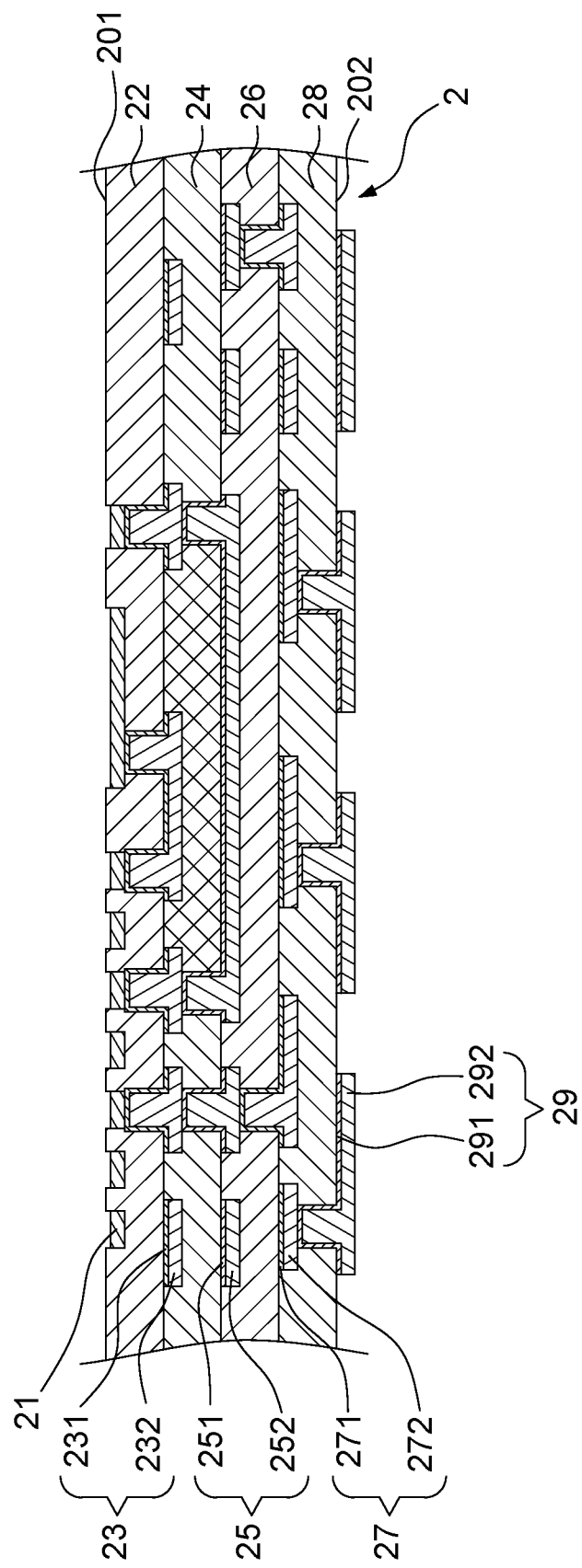
FIG. 31 illustrates one or more stages of an example of a method for manufacturing a semiconductor assembly according to some embodiments of the present disclosure.

Referring to FIG. 31, the carrier 60 is removed. Then, the seed layer 211 is removed by, for example, etching, to expose the first circuit layer 21. The first circuit layer 21 is thus exposed on and recessed from the first surface 201 of the wiring structure 2.

Figure 32:
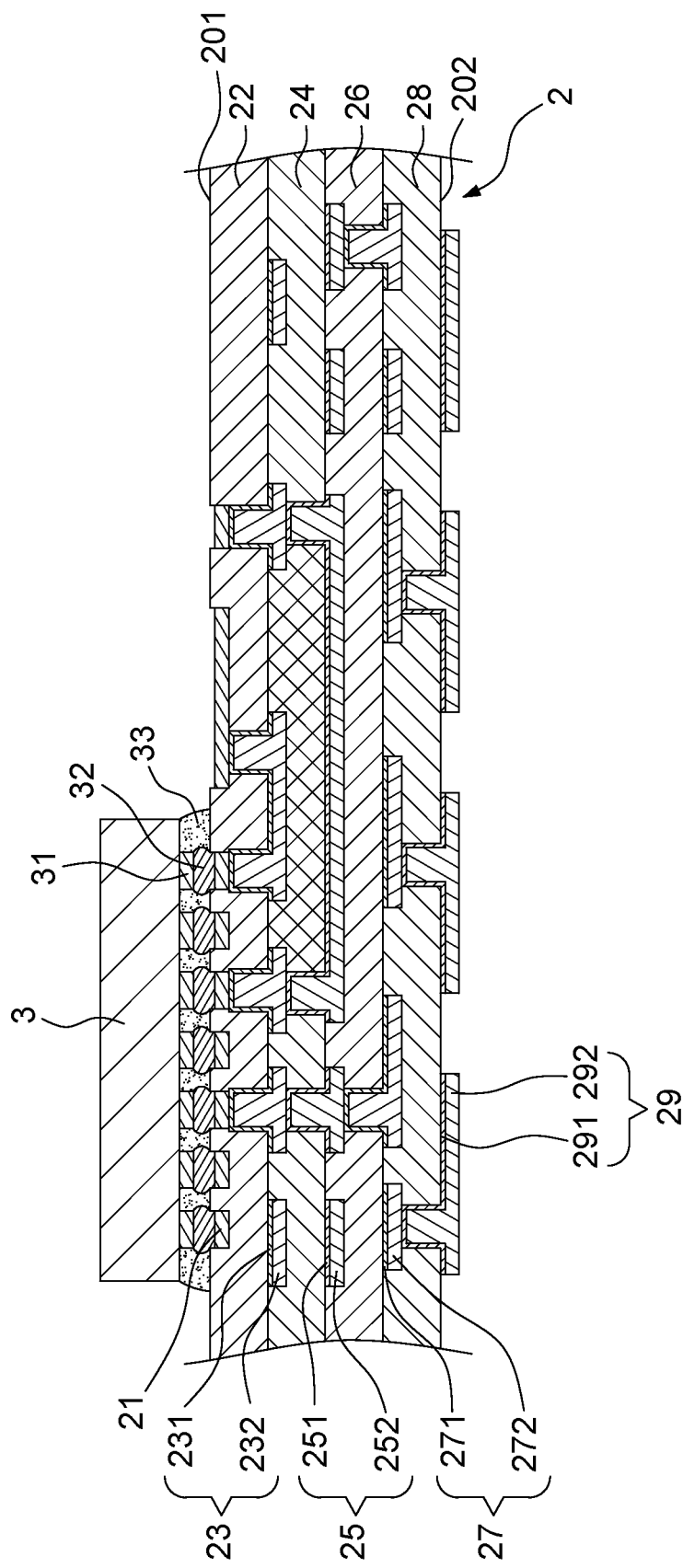
FIG. 32 illustrates one or more stages of an example of a method for manufacturing a semiconductor assembly according to some embodiments of the present disclosure.

Referring to FIG. 32, a semiconductor die 3 is disposed on the first surface 201 of the wiring structure 2. For example, the semiconductor die 3 is electrically connected to the first circuit layer 21 of the wiring structure 2 through a plurality of solders 32 disposed therebetween. An underfill 33 is then disposed between the semiconductor die 3 and the first surface 201 of the first wiring structure 2 to cover and protect the bumps 31 and the solders 32.

Figure 33:
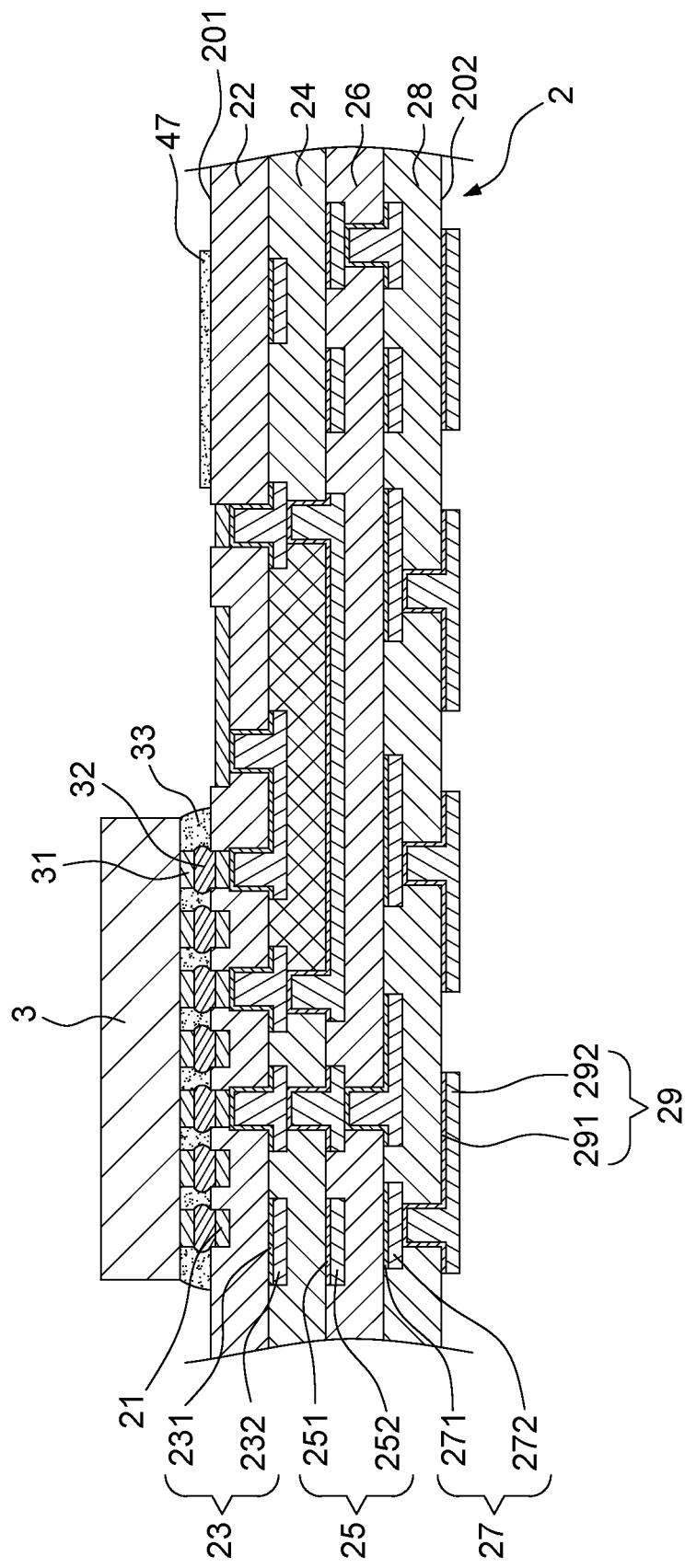
FIG. 33 illustrates one or more stages of an example of a method for manufacturing a semiconductor assembly according to some embodiments of the present disclosure.

Referring to FIG. 33, an adhesive layer 47 is disposed on the first surface 201 of the wiring structure 2.

Figure 34:
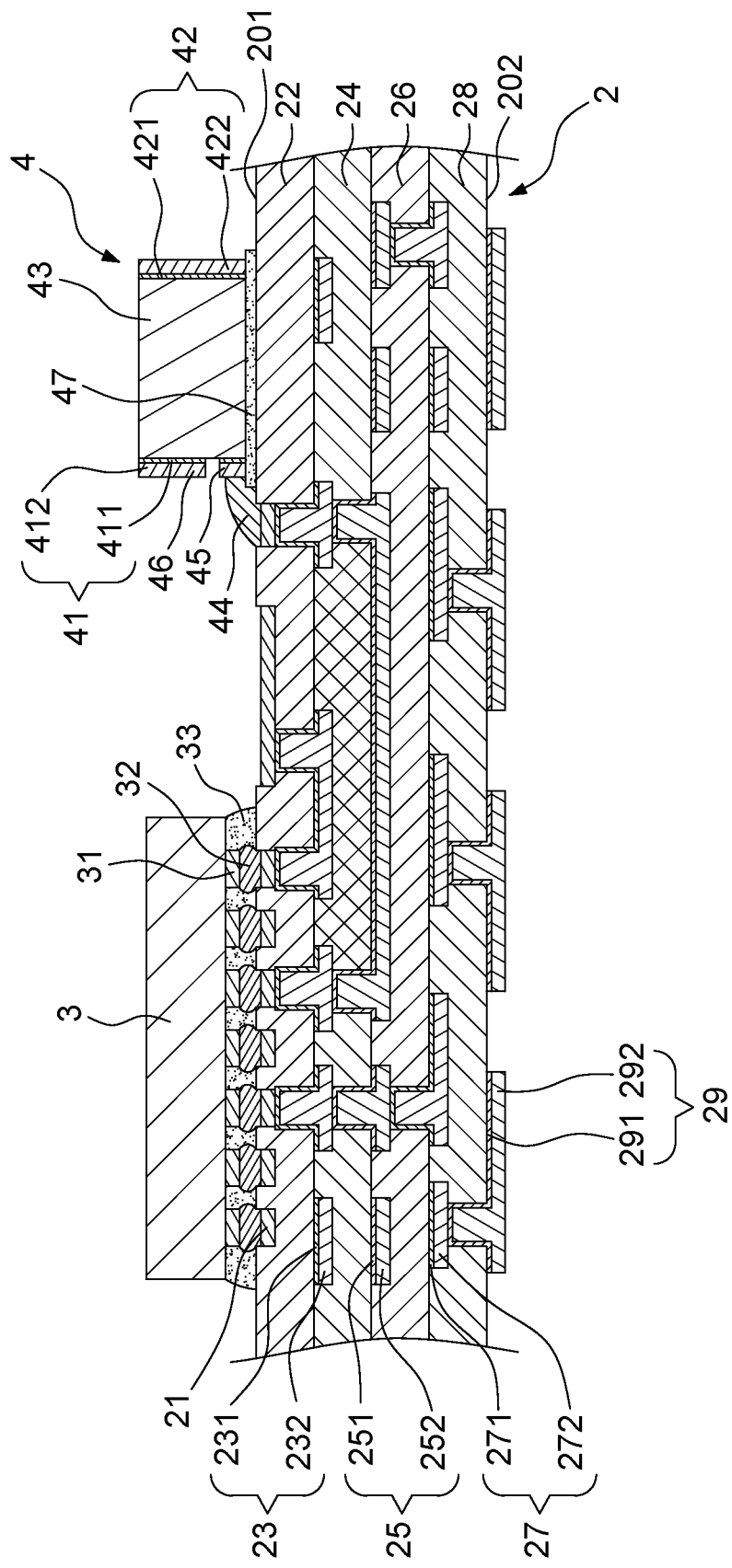
FIG. 34 illustrates one or more stages of an example of a method for manufacturing a semiconductor assembly according to some embodiments of the present disclosure.

Referring to FIG. 34, an electronic element (e.g., the electronic element 4 formed by the stages show in FIGS. 13 to 20) is electrically connected to the wiring structure 2. For example, the electronic element 4 is adhered to the first surface 201 of the wiring structure 2 through the adhesive layer 47, and is electrically connected to the first circuit layer 21 of the wiring structure 2 through a solder 44. The first metal layer 41 and the second metal layer 42 of the electronic element 4 are substantially perpendicular to the first surface 201 of the wiring structure 2.

In some embodiments, the electronic element 4 and/or the wiring structure 2 may be tested before electrically connecting the electronic element 4 to the wiring structure 2. Since the electronic element 4 and the wiring structure 2 are formed separately, the electronic element 4 and the wiring structure 2 may each be tested before electrically connected to each other. Hence, the electronic element 4 and the wiring structure 2 are known-good.

Then, a plurality of solder balls 14 is disposed on a bottommost circuit layer (e.g., the fifth circuit layer 29) of the wiring structure 2 for external connection purpose. Then, the wiring structure 2 is singulated, thus forming at least one semiconductor assembly, such as the semiconductor assembly 1 shown in FIG. 1.

In some embodiments, after the aforementioned stages, an encapsulant 16 may be formed or disposed on the wiring structure 2 for forming the semiconductor assembly 1d as shown in FIG. 8. The encapsulant 16 is disposed on the first surface 201 of the wiring structure 2 and covers and protects the semiconductor die 3 and the electronic element 4.

In another embodiment, after the stage shown in FIG. 32, the electronic element 4 is disposed on the second surface 202 of the wiring structure 2 instead of the first surface 201 for forming the semiconductor assembly 1a shown in FIG. 5. The electronic element 4 may be adhered to the second surface 202 of the wiring structure 2 through an adhesive layer 47 disposed on the second surface 202 of the wiring structure, and electrically connected to a bottommost circuit layer (e.g., the fifth layer 29) of the wiring structure 2 through a solder 44 connected therebetween. Then, a plurality of solder balls 14 may be disposed on the fifth circuit layer 29 for external connection purpose. Then, the wiring structure 2 may be singulated to form the semiconductor assembly 1a as shown in FIG. 5.

In still another embodiment, after the stage shown in FIG. 33, the electronic element 4 is disposed on the first surface 201 of the wiring structure 2, and both the first metal layer 41 and the second metal layer 42 of the electronic element 4 are electrically connected to the wiring structure 2 for forming the semiconductor assembly 1g shown in FIG. 11. Similar to the stage shown in FIG. 34, the electronic element 4 may also be adhered to the first surface 201 of the wiring structure 2 through an adhesive layer 47 disposed on the second surface 202 of the wiring structure 2, and the first metal layer 41 may be electrically connected to the first circuit layer 21 of the wiring structure 2 through the solder 44 connected therebetween. In addition, the second metal layer 42 may be connected to the first circuit layer 21 of the wiring structure 2 through the solder 44a connected therebetween. That is, the first metal layer 41 and the second metal layer 42 of the electronic element 4 are electrically connected to a same circuit layer (e.g., the first circuit layer 21) of the wiring structure 2. Then, a plurality of solder balls 14 may be disposed on the fifth circuit layer 29 for external connection purpose. Then, the wiring structure 2 may be singulated to form the semiconductor assembly 1g as shown in FIG. 11.

Figure 35:
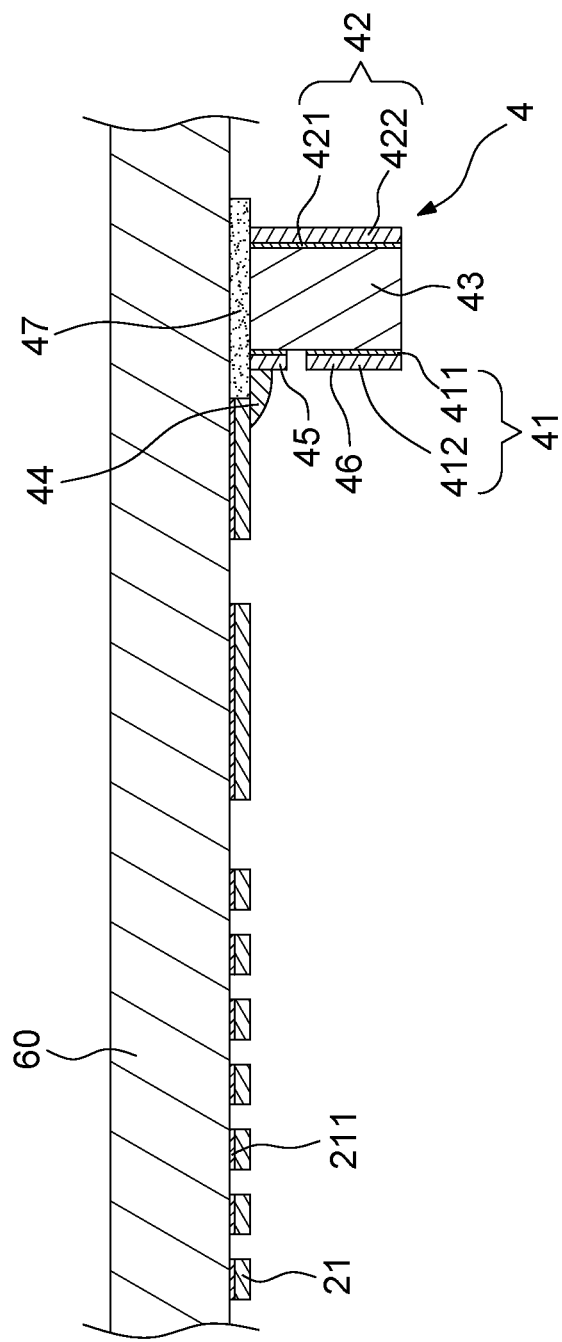
FIG. 35 illustrates one or more stages of an example of a method for manufacturing a semiconductor assembly according to some embodiments of the present disclosure.

FIG. 35 illustrate a method for manufacturing a semiconductor assembly according to some embodiments of the present disclosure. In some embodiments, the method is for manufacturing a semiconductor assembly such as the semiconductor assembly 1b shown in FIG. 6. The initial stages of the illustrated process are the same as, or similar to, the stages illustrated in FIG. 13 through FIG. 24. FIG. 35 depicts a stage subsequent to that depicted in FIG. 24.

Referring to FIG. 35, an electronic element (e.g., the electronic element 4 formed by the stages show in FIGS. 13 to 20) is electrically connected to the first circuit layer 21. For example, the electronic element 4 is adhered to the carrier 60 through an adhesive layer 47 disposed on the carrier 60, and is electrically connected to the first circuit layer 21 through a solder 44 connected therebetween.

The stages subsequent to the stage shown in FIG. 35 are similar to those shown in FIG. 25 through 32, thus forming a semiconductor assembly, such as the semiconductor assembly 1b shown in FIG. 6. For example, at least one additional circuit layer (e.g., the second circuit layer 23, the third circuit layer 25, the fourth circuit layer 27 and the fifth circuit layer 29) is formed on the first circuit layer 21 to form a wiring structure 2. After removing the carrier 60 and the seed layer 211, the first circuit layer 21 is exposed from the first surface 201 of the wiring structure 2. The electronic element 4 is embedded in the wiring structure 2. The first metal layer 41 and the second metal layer 42 are substantially perpendicular to the first surface 201 of the wiring structure 2. The semiconductor die 3 is then disposed on the first surface 201 of the wiring structure 2 and electrically connected to the first circuit layer 21 of the wiring structure 2.

Figure 36:
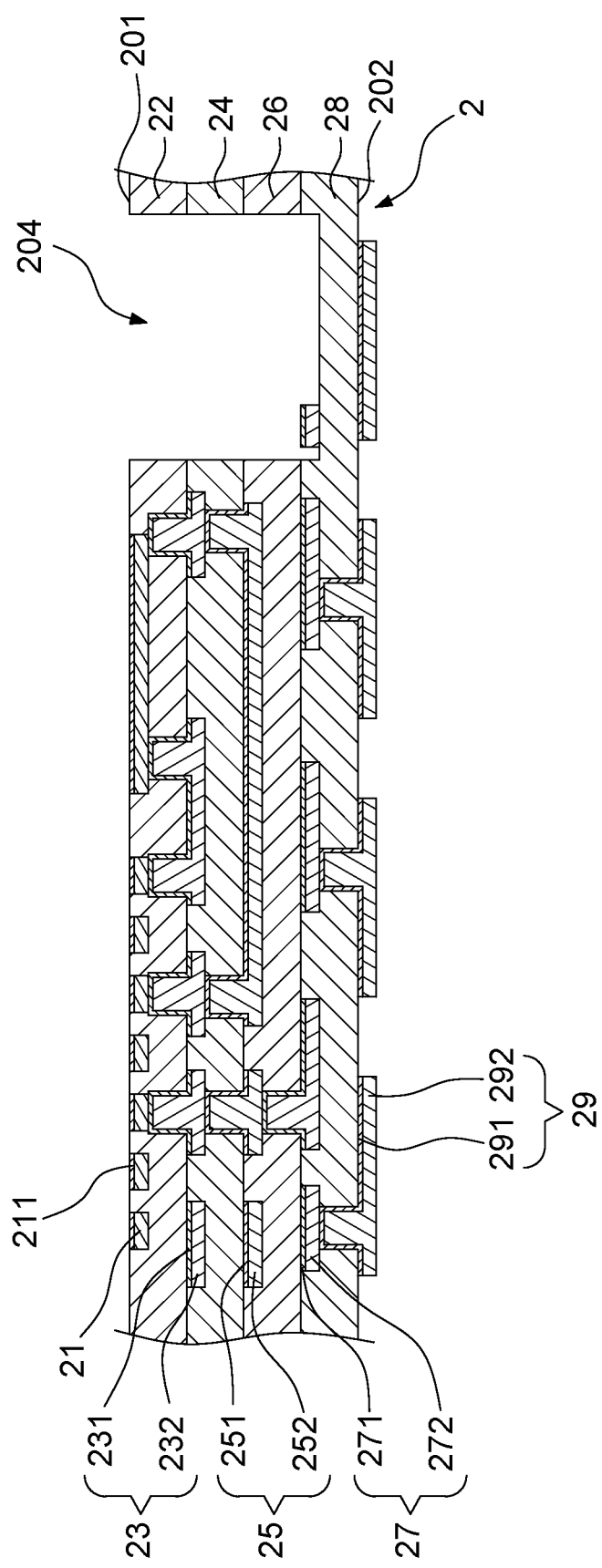
FIG. 36 illustrates one or more stages of an example of a method for manufacturing a semiconductor assembly according to some embodiments of the present disclosure.
Figure 37:
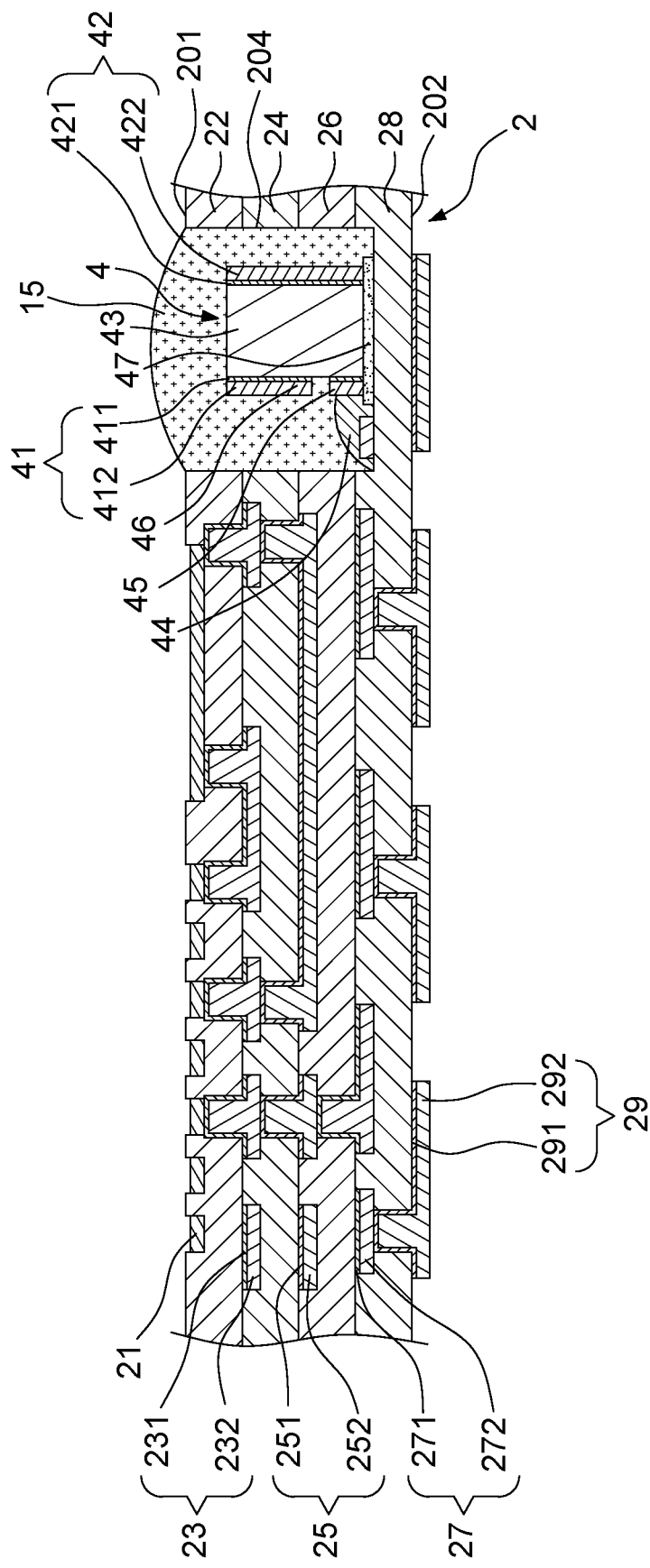
FIG. 37 illustrates one or more stages of an example of a method for manufacturing a semiconductor assembly according to some embodiments of the present disclosure.

FIG. 36 through FIG. 37 illustrate a method for manufacturing a semiconductor assembly according to some embodiments of the present disclosure. In some embodiments, the method is for manufacturing a semiconductor assembly such as the semiconductor assembly 1c shown in FIG. 7. The initial stages of the illustrated process are the same as, or similar to, the stages illustrated in FIG. 13 through FIG. 30. FIG. 36 depicts a stage subsequent to that depicted in FIG. 30.

Referring to FIG. 36, a cavity 204 is formed on the wiring structure 2 by, for example, laser drilling. The cavity 204 of the wiring structure 2 is recessed from the first surface 201, and exposes a circuit layer (e.g., the fourth circuit layer 27) of the wiring structure 2.

Referring to FIG. 37, the seed layer 211 and a portion of the seed layer 271 exposed in the cavity 204 may be removed. Accordingly, the first circuit layer 21 is exposed on the first surface 201 of the wiring structure 2, and a portion of the conductive layer 272 of the fourth circuit layer 27 is exposed in the cavity 204. Then, an electronic element (e.g., the electronic element 4 formed by the stages show in FIGS. 13 to 20) is electrically connected to the wiring structure 2.

For example, the electronic element 4 is disposed in the cavity 204 and is adhered to the wiring structure 2 through an adhesive layer 47. The electronic element 4 is electrically connected to the exposed portion of the fourth circuit layer 27 through a solder 44 connected therebetween. Then, a filling material 15 is disposed in the cavity 204 to cover the electronic element 4. The filling material 15 may fill the cavity 204 and cover the electronic element 4.

Then, similar to the stage shown in FIG. 32, a semiconductor die 3 may be electrically connected to the wiring structure 2. Then, a plurality of solder balls 14 is disposed on a bottommost circuit layer (e.g., the fifth circuit layer 29) of the wiring structure 2 for external connection purpose. Then, the wiring structure 2 is singulated, thus forming at least one semiconductor assembly, such as the semiconductor assembly 1c shown in FIG. 7.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor assembly, comprising:
a first wiring structure having a first surface;
a first semiconductor die disposed on the first surface of the first wiring structure; and
a first electronic element electrically connected to the first wiring structure, wherein the first electronic element includes a first metal layer, a second metal layer and a dielectric material interposed between the first metal layer and the second metal layer, and the first metal layer and the second metal layer are substantially perpendicular to the first surface of the first wiring structure.

2. The semiconductor assembly of claim 1, wherein the first electronic element is disposed on the first surface of the first wiring structure.

3. The semiconductor assembly of claim 1, wherein the first wiring structure has a second surface opposite to the first surface, and the first electronic element is disposed on the second surface of the first wiring structure.

4. The semiconductor assembly of claim 1, wherein the first electronic element is embedded in the first wiring structure.

5. The semiconductor assembly of claim 4, wherein the first semiconductor die and the first electronic element are electrically connected to a same circuit layer of the first wiring structure.

6. The semiconductor assembly of claim 1, wherein the first wiring structure defines a cavity recessed from the first surface, and the first electronic element is disposed in the cavity.

7. The semiconductor assembly of claim 6, wherein the cavity exposes a circuit layer of the first wiring structure, and the first electronic element is electrically connected to the exposed circuit layer.

8. The semiconductor assembly of claim 6, further comprising a filling material disposed in the cavity and covering the first electronic element.

9. The semiconductor assembly of claim 1, further comprising an encapsulant disposed on the first wiring structure and covering the first electronic element, wherein the encapsulant has a curved surface.

10. The semiconductor assembly of claim 1, further comprising:
- a second wiring structure having a first surface and a second surface opposite to the first surface;
- a second semiconductor die disposed on the first surface of the second wiring structure;
- a second electronic element disposed on the first surface of the second wiring structure;
- wherein the second wiring structure is disposed on and electrically connected to the first wiring structure.

11. The semiconductor assembly of claim 10, wherein the first surface of the second wiring structure faces the first surface of the first wiring structures.

12. The semiconductor assembly of claim 11, further comprising an encapsulant disposed between the first wiring structure and the second wiring structure.

13. The semiconductor assembly of claim 10, wherein the second surface of the second wiring structure faces the first surface of the first wiring structures.

14. The semiconductor assembly of claim 1, wherein the first metal layer and the second metal layer are electrically connected to a same circuit layer of the first wiring structure.

15. The semiconductor assembly of claim 1, wherein the first semiconductor die and the first electronic element are electrically connected to a topmost circuit layer of the first wiring structure.

16. The semiconductor assembly of claim 1, wherein the first semiconductor die is electrically connected to a topmost circuit layer of the wiring structure, and the first electronic element is electrically connected to a bottommost circuit layer of the first wiring structure.

\* \* \* \* \*